(12) United States Patent
Cui et al.

(10) Patent No.: US 12,010,835 B2
(45) Date of Patent: Jun. 11, 2024

(54) THREE-DIMENSIONAL MEMORY DEVICE WITH A CONDUCTIVE DRAIN-SELECT-LEVEL SPACER AND METHODS FOR FORMING THE SAME

(71) Applicant: SANDISK TECHNOLOGIES LLC, Addison, TX (US)

(72) Inventors: Zhixin Cui, Nagoya (JP); Satoshi Shimizu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 354 days.

(21) Appl. No.: 17/241,321

(22) Filed: Apr. 27, 2021

(65) Prior Publication Data
US 2022/0344362 A1    Oct. 27, 2022

(51) Int. Cl.
| | | |
|---|---|---|
| H10B 41/27 | (2023.01) | |
| G11C 8/14 | (2006.01) | |
| H10B 41/10 | (2023.01) | |
| H10B 43/10 | (2023.01) | |
| H10B 43/27 | (2023.01) | |

(52) U.S. Cl.
CPC .............. *H10B 41/27* (2023.02); *G11C 8/14* (2013.01); *H10B 41/10* (2023.02); *H10B 43/10* (2023.02); *H10B 43/27* (2023.02)

(58) Field of Classification Search
CPC ........ H10B 41/27; H10B 43/27; H10B 41/10; H10B 43/10
See application file for complete search history.

(56) References Cited

U.S. PATENT DOCUMENTS

| | | |
|---|---|---|
| 9,972,641 B1 | 5/2018 | Zhang et al. |
| 10,083,982 B2 | 9/2018 | Shigemura et al. |
| 10,115,681 B1 | 10/2018 | Ariyoshi |
| 10,192,878 B1 | 1/2019 | Tsutsumi et al. |
| 10,236,300 B2 | 3/2019 | Zhang et al. |
| 10,475,804 B1 | 11/2019 | Nishikawa et al. |
| 10,600,800 B2 | 3/2020 | Nishikawa et al. |
| 10,685,978 B1 | 6/2020 | Lu et al. |
| 10,685,979 B1 | 6/2020 | Lu et al. |
| 10,700,089 B1 | 6/2020 | Hojo et al. |

(Continued)

FOREIGN PATENT DOCUMENTS

| | | |
|---|---|---|
| KR | 10-1182942 B1 | 9/2012 |
| KR | 10-2016-0120990 A | 10/2016 |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Nicholas J Tobergte
*Assistant Examiner* — Adin Hrnjic
(74) *Attorney, Agent, or Firm* — THE MARBURY LAW GROUP PLLC

(57) ABSTRACT

A three-dimensional memory device includes an alternating stack of insulating layers and electrically conductive layers, memory opening fill structures vertically extending through the alternating stack in a memory array region, and an electrically conductive spacer extending vertically and electrically connecting a first drain-select-level electrically conductive layer to a second drain-select-level electrically conductive layer.

2 Claims, 41 Drawing Sheets

(56) References Cited

U.S. PATENT DOCUMENTS

| | | | |
|---|---|---|---|
| 10,777,575 | B1 | 9/2020 | Cui et al. |
| 10,879,313 | B2 | 12/2020 | Takahashi et al. |
| 10,991,761 | B2 | 4/2021 | Takahashi et al. |
| 2016/0111438 | A1* | 4/2016 | Tsutsumi .......... H01L 21/76802 257/314 |
| 2016/0336420 | A1* | 11/2016 | Chou ................. H01L 29/0649 |
| 2017/0358593 | A1* | 12/2017 | Yu ........................... H10B 43/27 |
| 2018/0138193 | A1 | 5/2018 | Zhang et al. |
| 2018/0138194 | A1 | 5/2018 | Shigemura et al. |
| 2018/0366482 | A1 | 12/2018 | Zhou et al. |
| 2019/0035803 | A1 | 1/2019 | Zhang et al. |
| 2020/0006358 | A1 | 1/2020 | Nishikawa et al. |
| 2020/0295030 | A1 | 9/2020 | Kim et al. |

OTHER PUBLICATIONS

U.S. Appl. No. 16/547,971, filed Aug. 22, 2019, SanDisk Technologies LLC.
U.S. Appl. No. 16/675,459, filed Nov. 6, 2019, SanDisk Technologies LLC.
U.S. Appl. No. 16/782,307, filed Feb. 5, 2020, SanDisk Technologies LLC.
U.S. Appl. No. 16/827,990, filed Mar. 24, 2020, SanDisk Technologies LLC.
U.S. Appl. No. 16/828,129, filed Mar. 24, 2020, SanDisk Technologies LLC.
U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 16/921,146, filed Jul. 6, 2020, SanDisk Technologies LLC.
U.S. Appl. No. 17/039,160, filed Sep. 30, 2020, SanDisk Technologies LLC.
U.S. Appl. No. 17/146,866, filed Jan. 12, 2021, SanDisk Technologies LLC.
U.S. Appl. No. 17/224,370, filed Apr. 7, 2021, SanDisk Technologies LLC.
U.S. Appl. No. 17/226,321, filed Apr. 9, 2021, SanDisk Technologies LLC.
Notification of Transmittal of The International Search Report and Written Opinion of the International Searching Authority for International Patent Application No. PCT/US2022/020454, mailed Oct. 12, 2022, 12 pages.

* cited by examiner

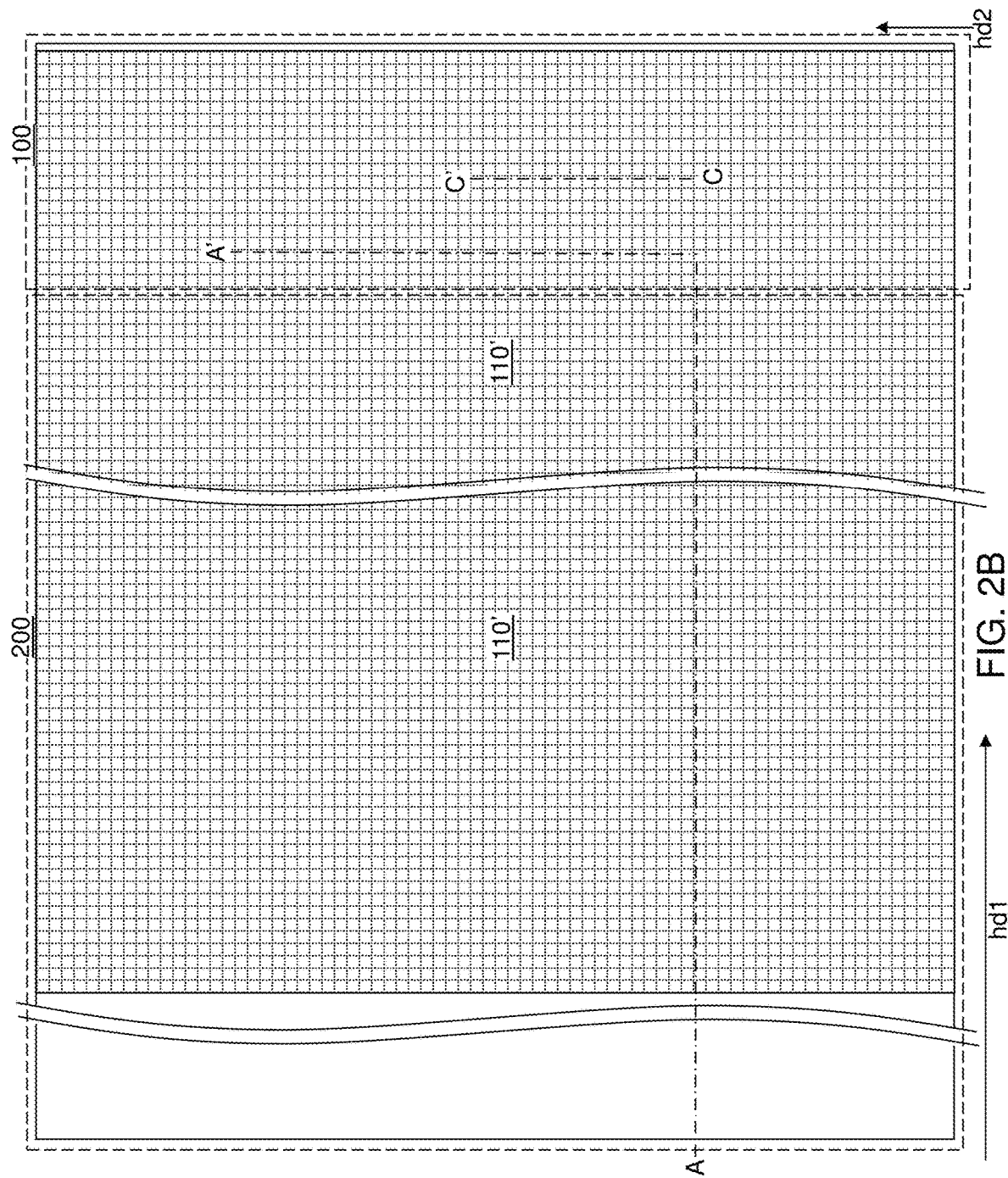

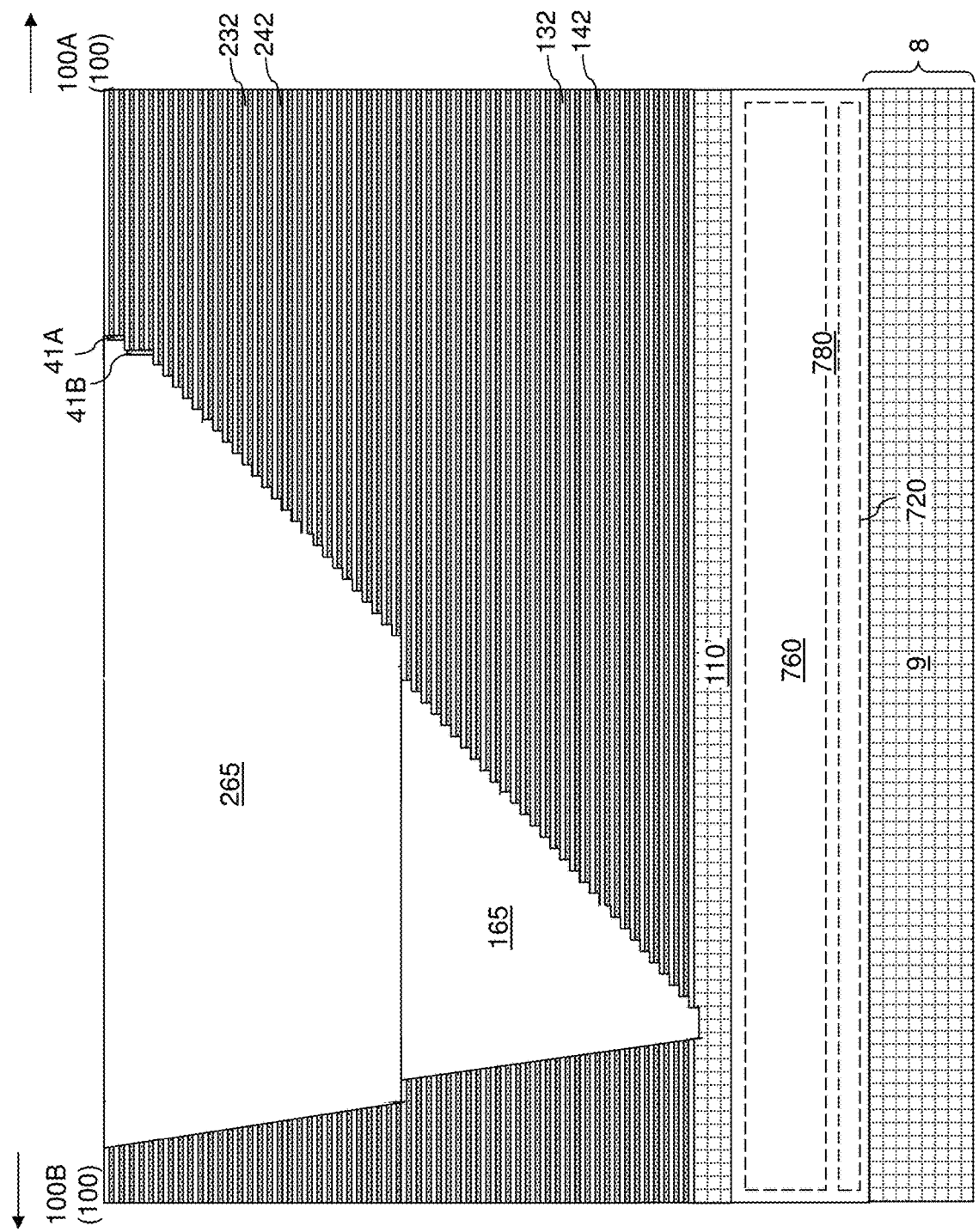

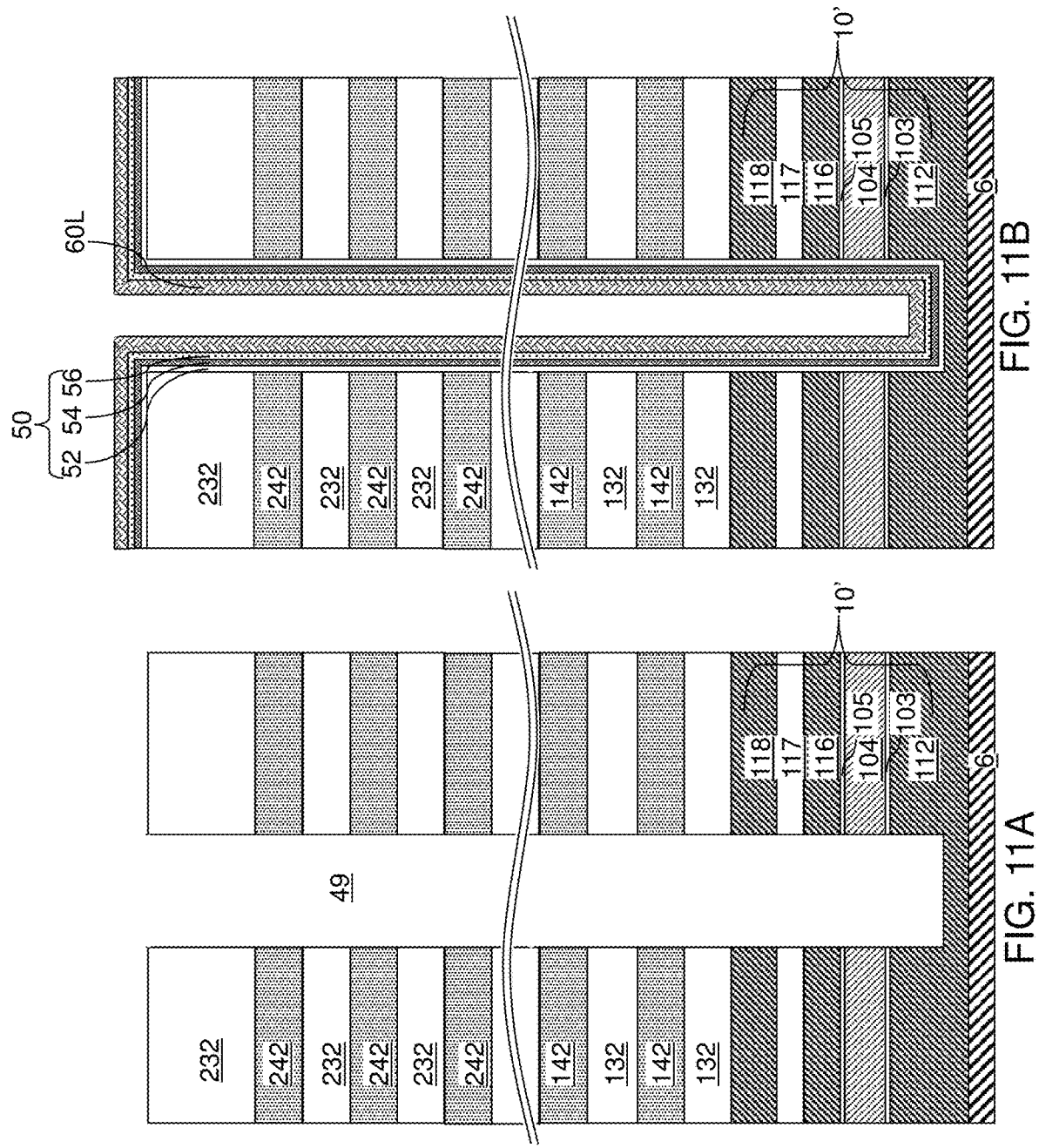

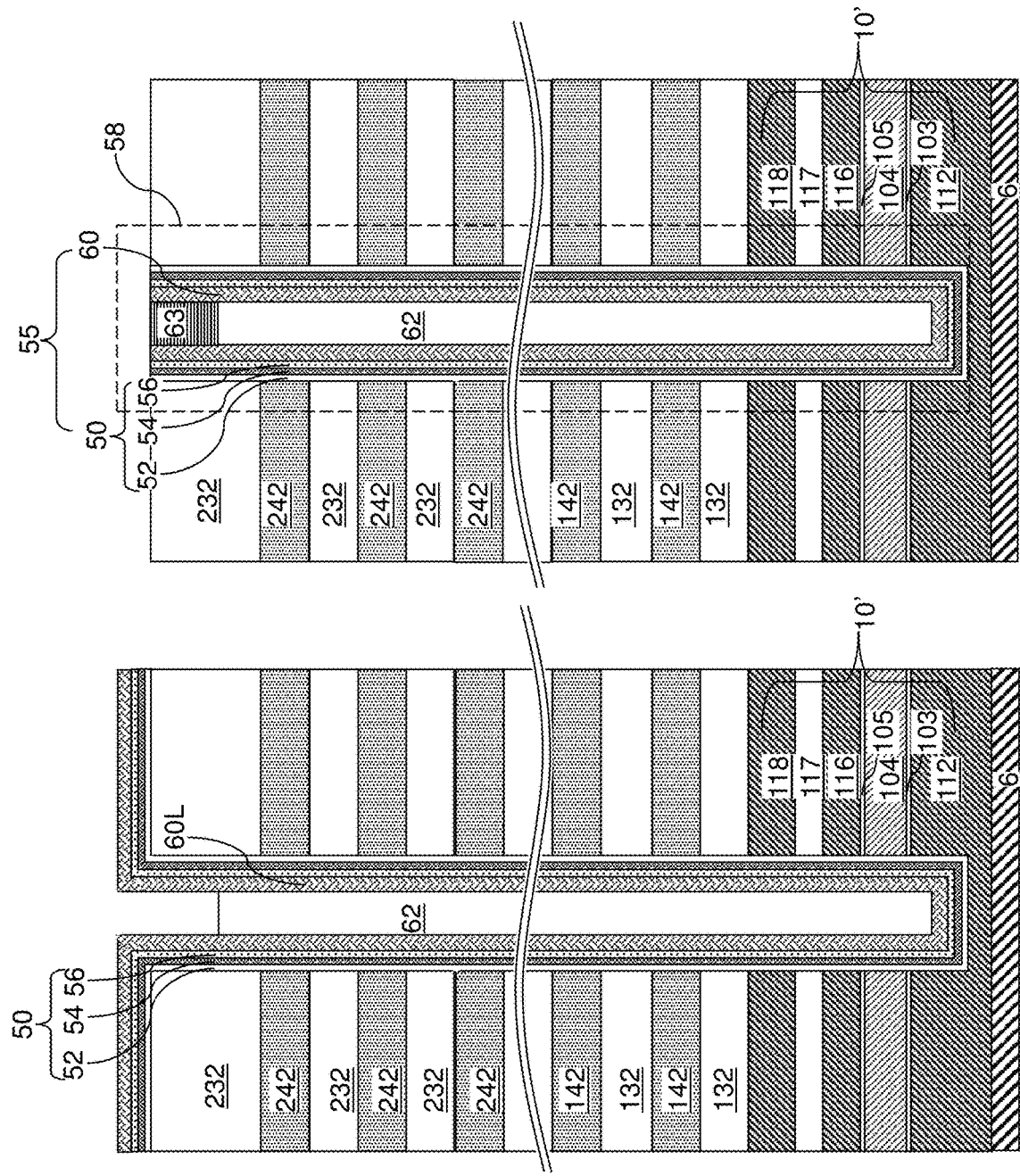

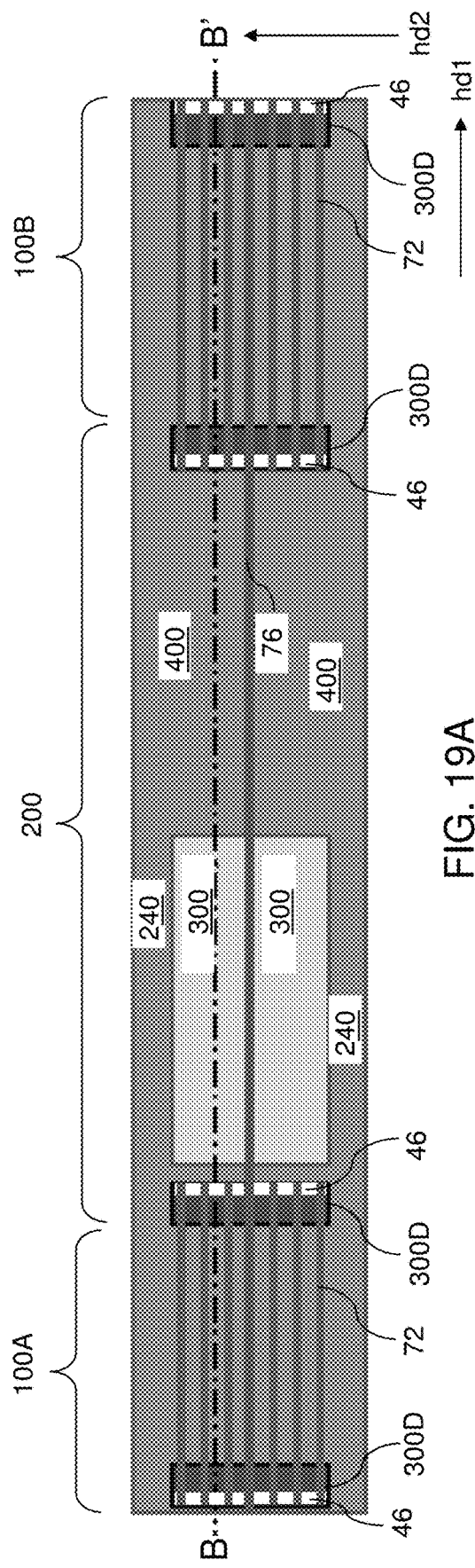
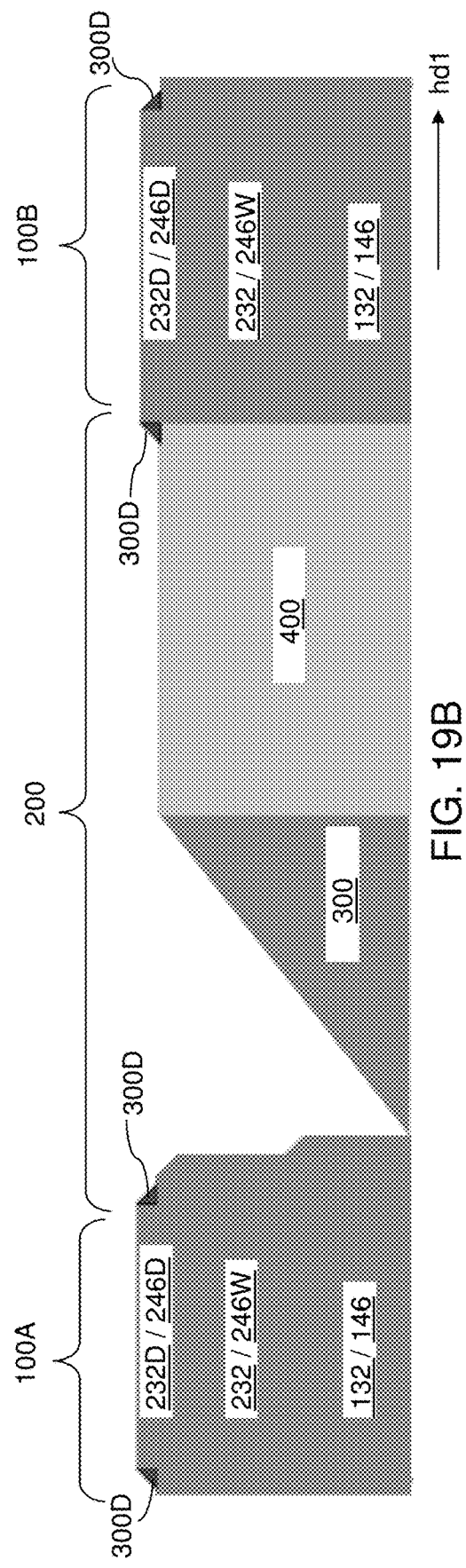

THREE-DIMENSIONAL MEMORY DEVICE WITH A CONDUCTIVE DRAIN-SELECT-LEVEL SPACER AND METHODS FOR FORMING THE SAME

FIELD

The present disclosure relates generally to the field of semiconductor devices, and particularly to a three-dimensional memory device with a conductive drain-select-level spacer electrically connecting multiple drain-select-level electrically conductive layers located at different levels and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device comprises an alternating stack of insulating layers and electrically conductive layers, wherein the electrically conductive layers comprise word-line-level electrically conductive layers and drain-select-level electrically conductive layers located above the word-line-level electrically conductive layers; a first backside trench fill structure extending along a first horizontal direction and comprising a first dielectric surface that contacts first sidewalls of each layer within the alternating stack; a second backside trench fill structure extending along the first horizontal direction, separated from the first backside trench fill structure along a second horizontal direction perpendicular to the first horizontal direction, and comprising a second dielectric surface that contacts second sidewalls of each layer within the alternating stack; drain-select-level isolation structures extending through the drain-select-level electrically conductive layers but not the word-line-level electrically conductive layers of alternating stack, wherein the drain-select-level isolation structures extend in the first horizontal direction and are spaced apart along the second horizontal direction; memory opening fill structures vertically extending through the alternating stack in a memory array region in which each layer within the alternating stack is present, wherein each of the memory opening fill structures comprises a vertical semiconductor channel and a memory film; and an electrically conductive spacer extending vertically and electrically connecting a first drain-select-level electrically conductive layer of the drain-select-level electrically conductive layers to a second drain-select-level electrically conductive layer of the drain-select-level electrically conductive layers, wherein the electrically conductive spacer extends along the second horizontal direction and contacts ends of the first and the second drain-select-level electrically conductive layers along the second horizontal direction.

According to another aspect of the present disclosure, a method of forming a memory device comprises forming a vertically alternating sequence of insulating layers and sacrificial material layers over a substrate; forming at least one multi-level vertical step at upper levels of the vertically alternating sequence by patterning the vertically alternating sequence, wherein each of the at least one multi-level vertical step comprises vertically coincident sidewalls of two or more insulating layers and two or more sacrificial material layers within the vertically alternating sequence; forming at least one sacrificial spacer on each of the at least one multi-level vertical step; forming single-level vertical steps at lower levels of the vertically alternating sequence located below the upper levels by patterning the vertically alternating sequence; forming memory openings vertically extending through the vertically alternating sequence; forming memory opening fill structures in the memory openings, wherein each of the memory opening fill structures comprises a respective vertical semiconductor channel and a respective memory film; and replacing the sacrificial material layers and the at least one sacrificial spacer with electrically conductive layers and at least one electrically conductive spacer, respectively.

BRIEF DESCRIPTION OF THE DRAWINGS

FIG. 2B is a top-down view of the exemplary structure of FIG. 2A. The hinged vertical plane A-A' is the plane of the vertical cross-sectional view of FIG. 2A.

FIG. 8A is a vertical cross-sectional view of the exemplary structure along the first horizontal direction after formation of a second-tier retro-stepped dielectric material portion according to an embodiment of the present disclosure.

FIGS. 11A-11D illustrate sequential vertical cross-sectional views of a memory opening during formation of a memory opening fill structure according to an embodiment of the present disclosure.

FIG. 19A is a schematic top view of a memory plane, and FIG. 19B is a schematic vertical cross-sectional view of the memory plane along line B-B' in FIG. 19A.

DETAILED DESCRIPTION

Figure 1A:
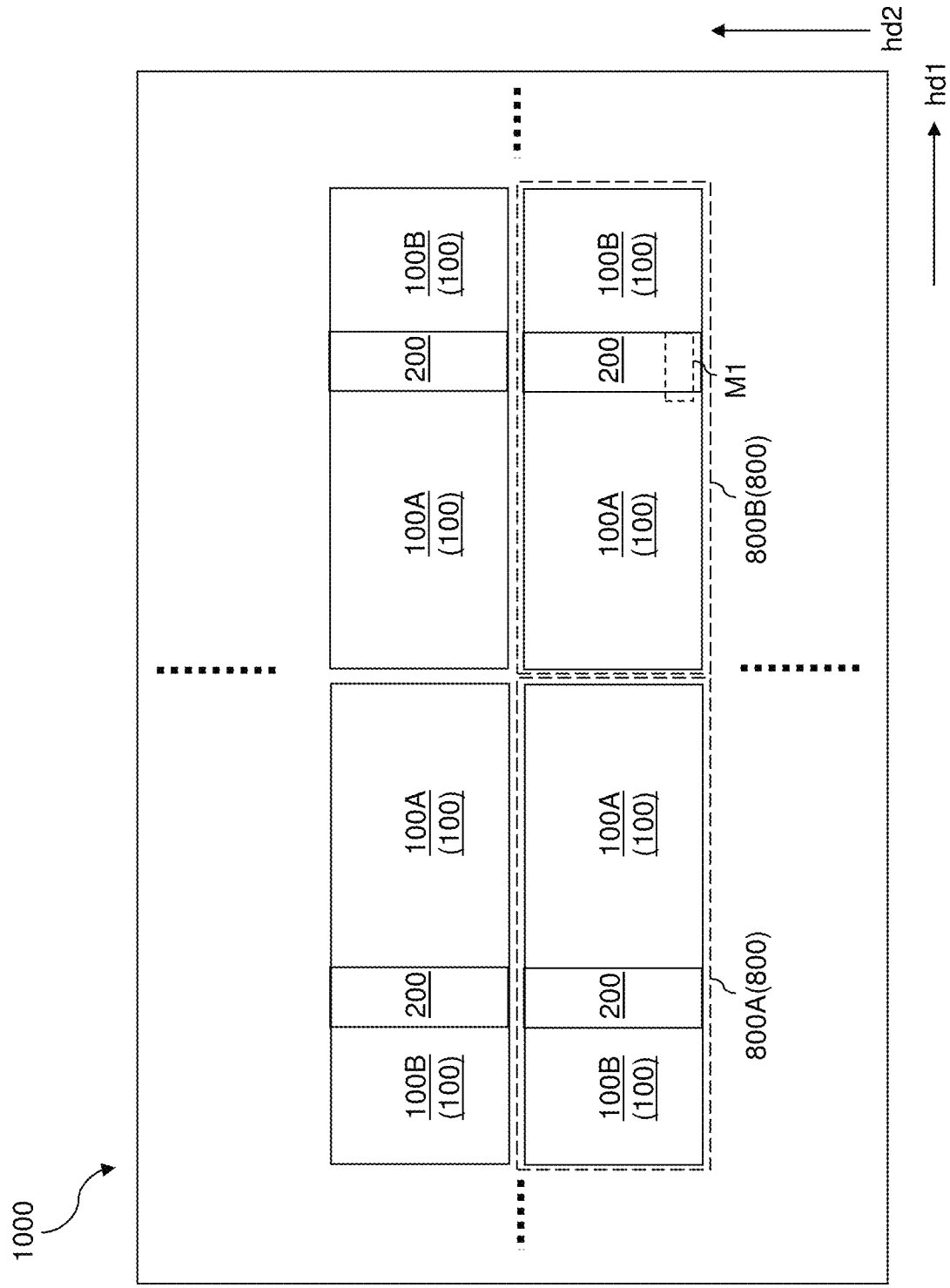
FIG. 1A is a plan view of an exemplary semiconductor die including multiple three-dimensional memory array regions according to a first embodiment of the present disclosure.

As discussed above, the embodiments of the present disclosure are directed to a three-dimensional memory device with a conductive drain-select-level spacer electrically connecting multiple drain-select-level electrically conductive layers located at different levels and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1E, an exemplary semiconductor die 1000 according to an embodiment of the present disclosure is illustrated. The exemplary semiconductor die 1000 includes multiple three-dimensional memory array regions and multiple inter-array regions. The exemplary semiconductor die 1000 can include multiple planes 800 (e.g., 800A, 800B), each of which includes two memory array regions 100, such as a first memory array region 100A and a second memory array region 100B that are laterally spaced apart by a respective inter-array region 200.

Generally, a semiconductor die 1000 may include a single plane 800 or multiple planes. The total number of planes in the semiconductor die 1000 may be selected based on performance requirements on the semiconductor die 1000. A pair of memory array regions 100 in a plane 800 may be laterally spaced apart along a first horizontal direction hd1 (which may be the word line direction). A second horizontal direction hd2 (which may be the bit line direction) can be perpendicular to the first horizontal direction hd1. The inter-array region 200 includes a staircase regions 300, a vertical interconnection regions 400 and bridge regions 240 located between neighboring staircase region and vertical interconnection region 400 which are spaced apart along the second horizontal direction hd2.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 146), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by backside trench fill structures 76 that laterally extend along the first horizontal direction hd1.

The exemplary structure can include source-level material layers 110 that contain at least one doped semiconductor material layer that functions as a source region. For example, the source-level material layers 110 may include a source contact layer (not expressly illustrated) that contacts vertical semiconductor channels within the memory opening fill structures 58. An exemplary configuration for the source-level material layers 110 is subsequently described in detail. In one embodiment, the source-level material layers 110 may be a substrate. Optionally, underlying dielectric material layers may be provided underneath the source-level material layers 110. In this case, the underlying dielectric material layers are referred to as lower-level dielectric material layers 760.

A first-tier alternating stack of first insulating layers 132 and first electrically conductive layers 146 is located over a substrate (which may include the source-level material layers 110 or another structure, such as a silicon wafer that underlies the source-level material layers 110) between each neighboring pair of backside trench fill structures 76. A first-tier retro-stepped dielectric material portion 165 overlies, and contacts, first stepped surfaces of the first-tier alternating stack (132, 146) in the staircase region 300. A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of backside trench fill structures 76. A second-tier retro-stepped dielectric material portion 265 overlies, and contacts, second stepped surfaces of the second-tier alternating stack (232, 246). Vertical steps S of the first stepped surfaces and the second stepped surfaces laterally extend along the second horizontal direction hd2 (e.g., bit line direction) in the staircase regions 300.

Memory opening fill structures 58 can be located within each memory array region 100 (which includes a first memory array region 100A and a second memory array region 100B) between each neighboring pair of backside trench fill structures 76. The memory opening fill structures 58 can be located within memory openings that vertically extend through each layer within the first-tier alternating stack (132, 146) and the second-tier alternating stack (232, 246) that are located between a respective neighboring pair of backside trench fill structures 76.

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146) and a second-tier alternating stack (232, 246) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165 and a second-tier retro-stepped dielectric material portion 265 are located.

A first-tier retro-stepped dielectric material portion 165 can be located between each neighboring pair of backside trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective backside trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of backside trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective backside trench fill structure 76. The second stepped surfaces comprise vertical steps of the second-tier alternating stack (232, 246) that are laterally spaced apart along the first horizontal direction hd1 and vertically offset from each other. In one embodiment, each second-tier retro-stepped dielectric material portion 265 overlies, and contacts, a respective one of the first-tier retro-stepped dielectric material portions 165.

Backside trenches can laterally extend along the first horizontal direction hd1. Each backside trench can be filled with a backside trench fill structure 76, which may include a combination of a backside contact via structure and an insulating spacer that laterally surround the backside contact via structure. Alternatively, each backside trench fill structure 76 may consist of an insulating fill structure. Each contiguous combination of a first-tier alternating stack (132, 146) and an overlying second-tier alternating stack (232, 246) can be located between a neighboring pair of backside trench fill structure 76.

For each contiguous combination of a first-tier alternating stack (132, 146) and an overlying second-tier alternating stack (232, 246), a respective first backside trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second backside trench fill structure 76 laterally extends along the first horizontal direction hd1 and contacts second sidewalls of the first-tier alternating stack (132, 146) and second sidewalls of the second-tier alternating stack (232, 246). The first backside trench fill structure 76 can contact each layer within the first-tier alternating stack (132, 146) and the second-tier alternating stack (232, 246), and can contact a sidewall of the first-tier retro-stepped dielectric material portion 165. The second backside trench fill structure 76 can contact each layer within the first-tier alternating stack (132, 146) and the second-tier alternating stack (232, 246), and can be laterally spaced from the first-tier retro-stepped dielectric material portion 165.

A contact-level dielectric layer 280 can be provided over each second-tier alternating stack (232, 246). In one embodiment, first contact via structures 86A vertically extend through a second-tier retro-stepped dielectric material portion 265 and a first-tier retro-stepped dielectric material portion 165, and contact a respective one of the first electrically conductive layers 146. Second contact via structures 86B vertically extend through a second-tier retro-stepped dielectric material portion 265 and contact a respective one of the second electrically conductive layers 246.

For each contiguous combination of a first-tier alternating stack (132, 146) and an overlying second-tier alternating stack (232, 246), a second-tier retro-stepped dielectric material portion 265 overlies second stepped surfaces of the second-tier alternating stack (232, 246), and second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first memory opening fill structures 58 can be located within a first memory array region 100A in which each layer of the first-tier alternating stack and each layer of the second-tier alternating stack are present. Second memory opening fill structures 58 can be located within a second memory array region 100B that is laterally offset along the first horizontal direction hd1 from the first memory array region 100A by the first-tier retro-stepped dielectric material portion 165 and the second-tier retro-stepped dielectric material portion 265. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through a strip-shaped connection region (e.g., a "bridge" region) 240 within an inter-array region 200 located between a backside trench fill structures 76 and the second-tier retro-stepped dielectric material portion 265 at the level of the second-tier alternating stack (232, 246), and between the backside trench fill structure 76 and the first-tier retro-stepped dielectric material portion 165 at the level of the first-tier alternating stack (132, 146).

Each combination of a first-tier alternating stack (132, 146) and an overlying second-tier alternating stack (232, 246) can be located between a respective neighboring pair of backside trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246) may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246), and a backside trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

Staircases including the first stepped surfaces and the second stepped surfaces of combinations of a first-tier alternating stack (132, 146) and an overlying second-tier alternating stack (232, 246) can ascend (i.e., rise) from the substrate along the first horizontal direction hd1, or along the opposite direction of the first horizontal direction hd1.

The inter-array region 200 includes strips of the first insulating layers 132, the first electrically conductive layers 146, the second insulating layers 232, and the second electrically conductive layers 246 located between each laterally neighboring pair of backside trench fill structures 76. The portions of the strips in the respective strip-shaped connection ("bridge") regions 240 of the inter-array regions 200 located adjacent to a respective first-tier retro-stepped dielectric material portion 165 and a respective second-tier retro-stepped dielectric material portion 265 have a narrower width along the second horizontal direction hd2 than portions of the alternating stacks (132, 146, 232, 246) located in the memory array regions 100, and portions of the strips located in the remaining portions of the inter array regions 200 outside of the respective strip-shaped connection ("bridge") regions 240. Each layer within the first-tier alternating stack (132, 146) and the second-tier alternating stack (232, 246) comprises a respective strip portion located within the inter-array region 200 and laterally extending continuously from the first memory array region 100A to the second memory array region 100B. Thus, each strip of the first insulating layers 132, the first electrically conductive layers 146, the second insulating layers 232, and the second electrically conductive layers 246 can continuously extend from the first memory array region 100A to the second memory array region 100B.

Figure 1B:
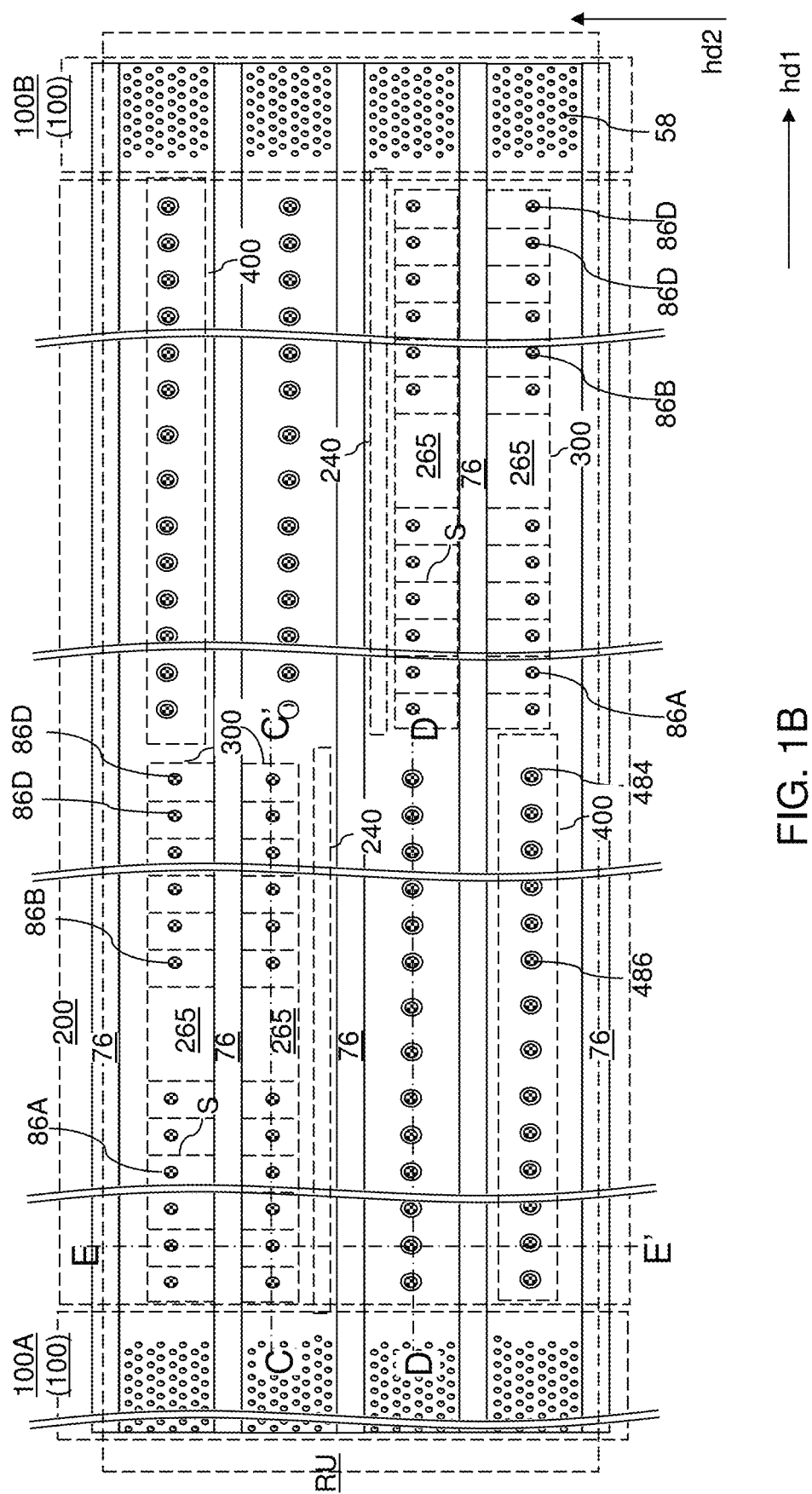
FIG. 1B is a schematic see-through top-down view of region M1 of FIG. 1A.
Figure 1C:
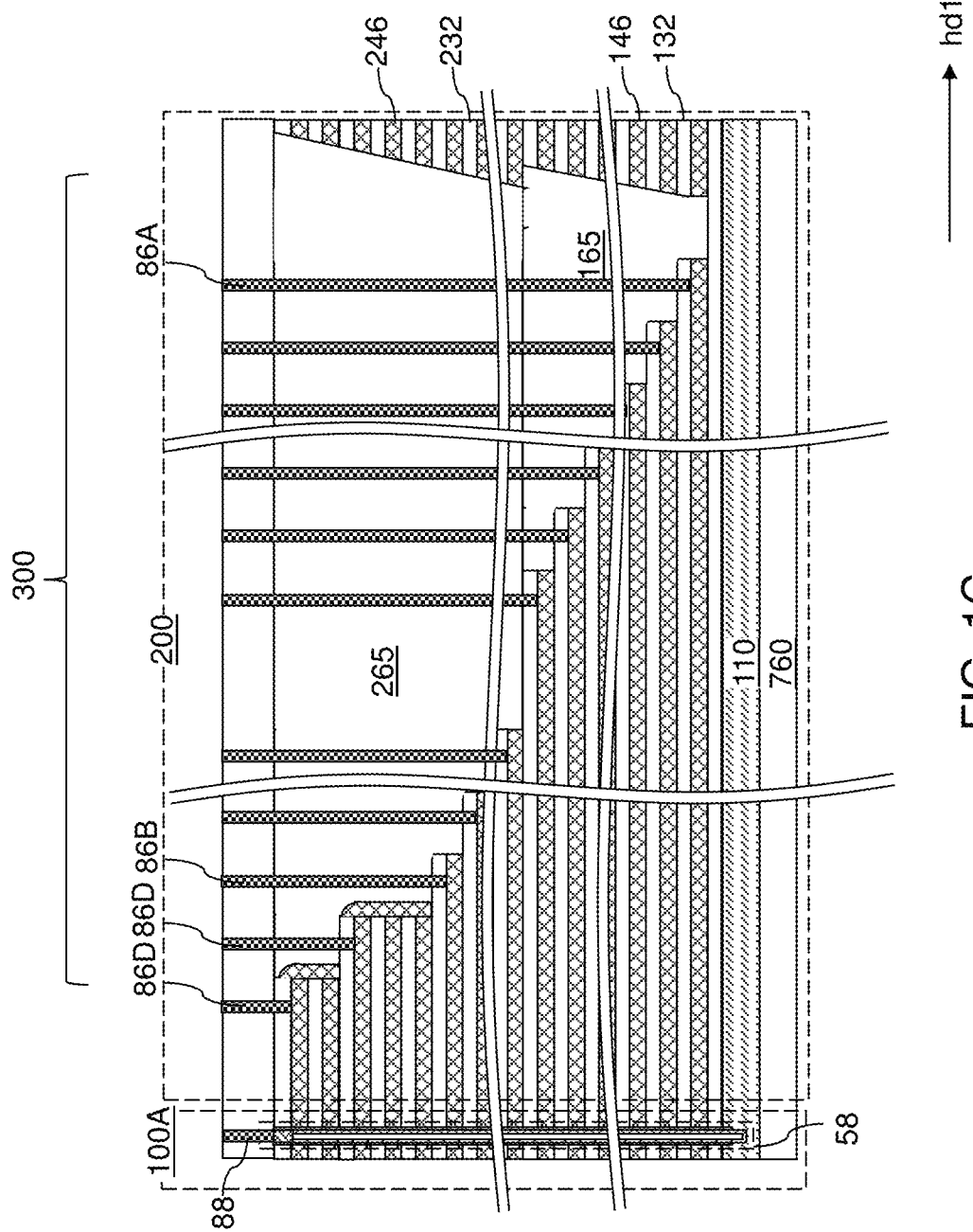
FIG. 1C is a schematic vertical cross-sectional view of a region of the exemplary semiconductor die along the vertical plane C-C' of FIG. 1B.
Figure 1D:
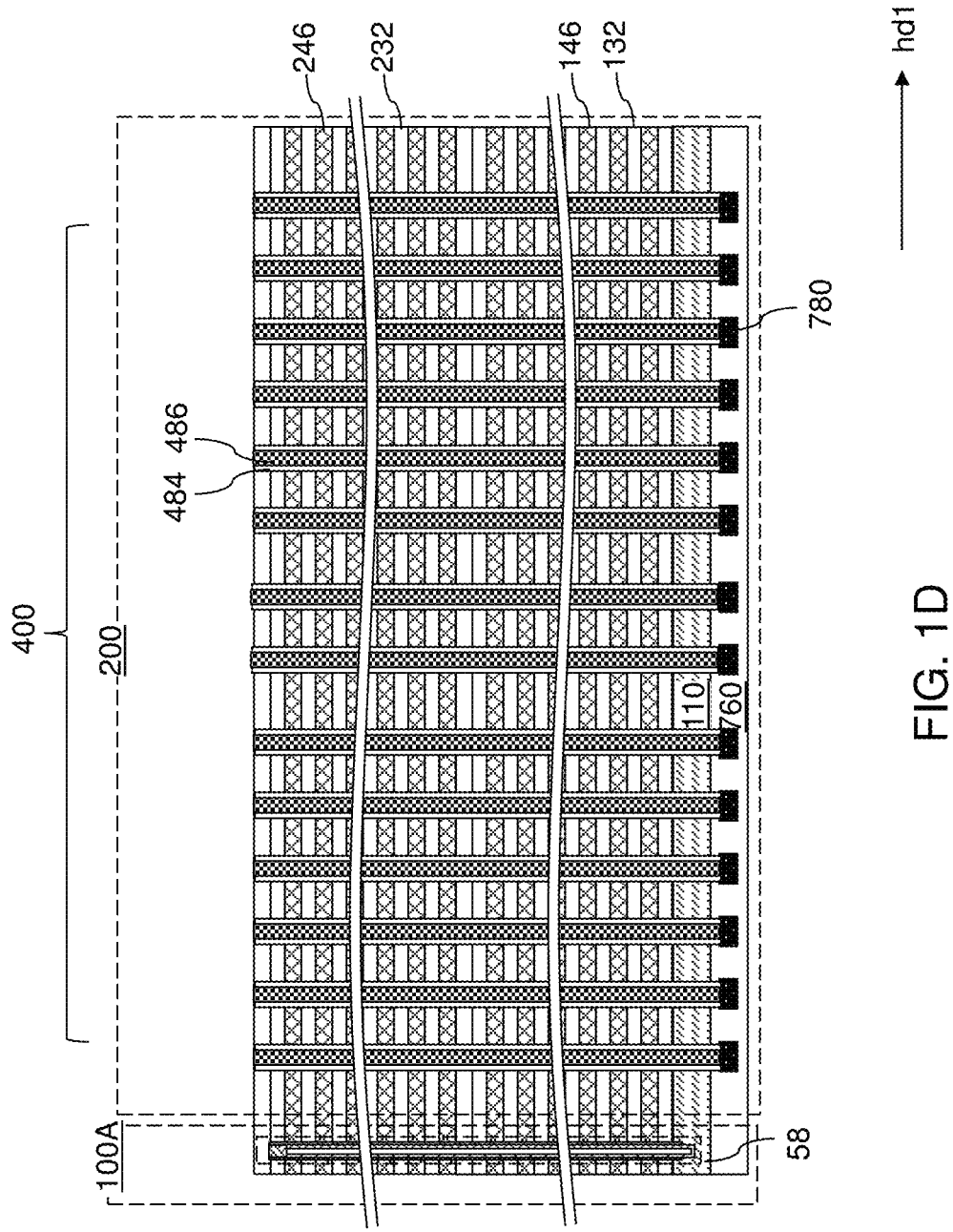
FIG. 1D is a schematic vertical cross-sectional view of a region of the exemplary semiconductor die along the vertical plane D-D' of FIG. 1B.
Figure 1E:
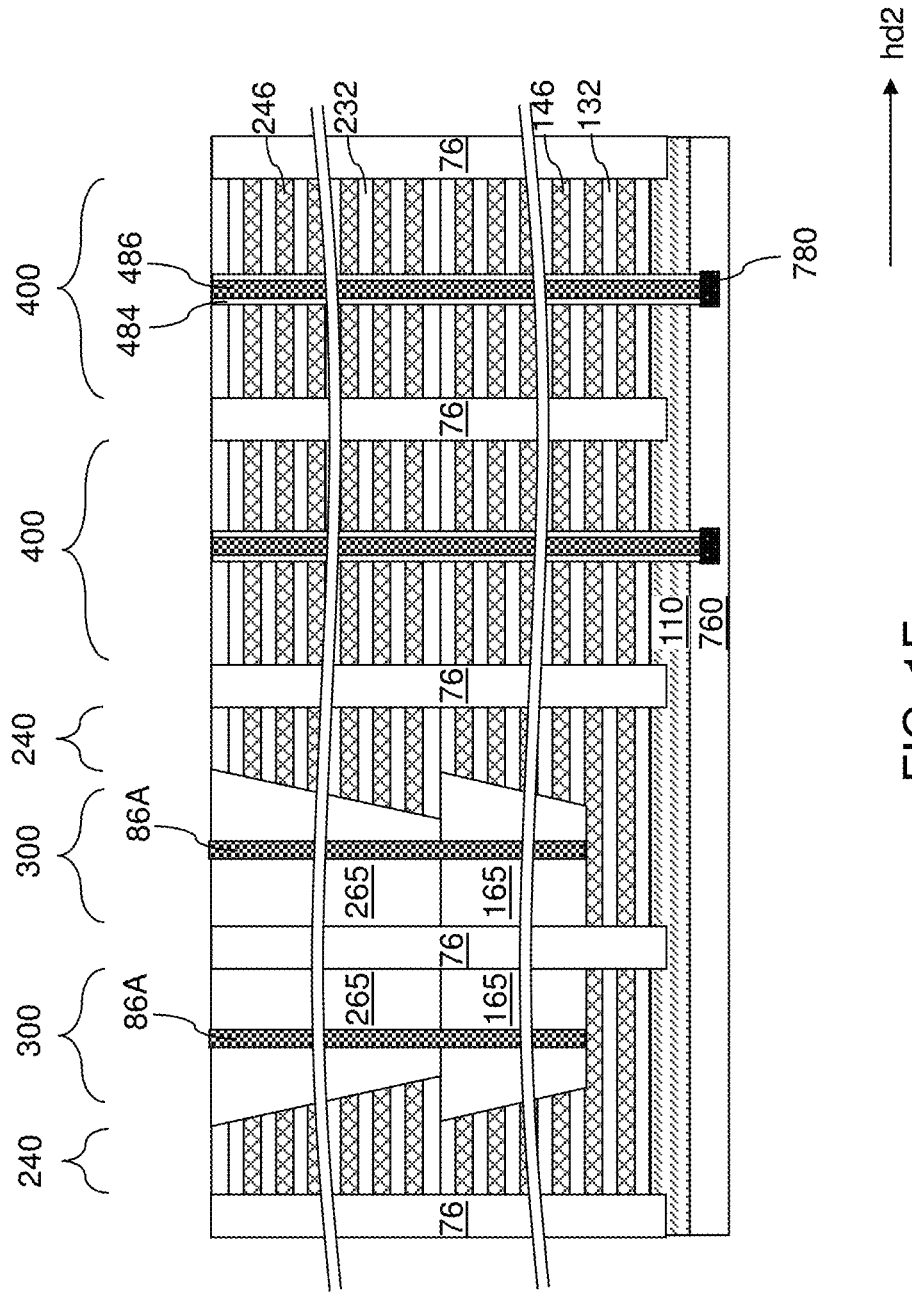
FIG. 1E is a schematic vertical cross-sectional view of a region of the exemplary semiconductor die along the vertical plane E-E' of FIG. 1B.

Laterally-isolated vertical interconnection structures (484, 486) can be formed through the vertical interconnection region 400 located in the inter-array region 200 as shown in FIGS. 1B, 1D and 1E. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146) and the second-tier alternating stack (232, 246), and contact a respective one of the lower-level metal interconnect structures 780.

Drain contact via structures (not illustrated) can extend through the contact-level dielectric layer 280, and can contact an upper portion of a respective memory opening fill structure 58 (such as a drain region within the respective memory opening fill structure 58). Bit lines (not illustrated) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

In one embodiment, upon sequentially numbering the backside trench fill structures 76 along the second horizontal direction hd2 with positive integers, each odd-numbered backside trench fill structure 76 contacts a respective pair of first-tier retro-stepped dielectric material portions 165 (and a respective pair of second-tier retro-stepped dielectric material portions 265) and each even-numbered backside trench fill structure 76 does not contact any of the first-tier retro-stepped dielectric material portions 165 (or any of the second-tier retro-stepped dielectric material portions 265).

Each backside trench fill structure 76 includes an insulating material portion that contacts sidewalls of a neighboring pair of alternating stacks (132, 146, 232, 246). In one embodiment, each insulating material portion may comprise an insulating spacer that laterally surrounds a contact via structure such as a backside contact via structure (not expressly shown). In another embodiment, each insulating material portion may comprise a dielectric wall structure which takes up the entire volume of the respective backside trench fill structure 76. In one embodiment, each sidewall of the first alternating stacks (132, 146) can be contacted by a sidewall of an insulating material portion of a respective one of the backside trench fill structures 76.

In one embodiment, each plane 800 within the exemplary semiconductor die 100 includes a three-dimensional memory device, which includes alternating stacks of insulating layers (132, 232) and electrically conductive layers (146, 246). Each of the alternating stacks {(132, 146), (232, 246)} laterally extends along a first horizontal direction hd1 through a first memory array region 100A and a second memory array region 100B that are laterally spaced apart by an inter-array region 200. Each of the alternating stacks {(132, 146), (232, 246)} includes a set of stepped surfaces (i.e., a staircase) in the inter-array region (i.e., staircase region) 200. Each plane 800 within the exemplary semiconductor die 1000 includes retro-stepped dielectric material portions (165, 265) overlying a respective set of stepped surfaces of the alternating stacks {(132, 146), (232, 246)}. Each plane 800 within the exemplary semiconductor die 1000 includes clusters of memory stack structures located within memory opening fill structures 58. Each of the memory stack structures vertically extends through a respective one of the alternating stacks {(132, 146), (232, 246)} and is located within the first memory array region 100A or the second memory array region 100B. Each memory stack structure can include a respective vertical semiconductor channel and a vertical stack of memory elements (e.g., a memory film) located at levels of the electrically conductive layers (146, 246).

The three-dimensional memory device can comprise layer contact via structures (e.g., word line contact via structures) (86A, 86B) vertically extending through a respective one of the retro-stepped dielectric material portions (165, 265) and contacting a respective one of the electrically conductive layers (146, 246). In one embodiment, for each pair of electrically conductive layers (146 or 246) located within a same alternating stack, a layer contact via structure (86A, 86B) that contacts an overlying electrically conductive layer is more proximal to the first memory array region 100A than a layer contact via structure that contacts an underlying electrically conductive layer is to the first memory array region 100A. In other words, the higher the bottom surface of a layer contact via structure (86A, 86B) is from a substrate (110, 760), the closer the layer contact via structure (86A, 86B) is to the first memory array region 100A. In other words, the staircases generally ascend (i.e., rise up) from the shorter second memory array region 100B towards the longer first memory array region 100A in each plane 800.

Electrical connection between each layer contact via structure (86A, 86B) and a portion of each electrically conductive layer (146 or 246) within the second memory array region 100B is provided by a strip portion of the electrically conductive layer (146 or 246) located in the bridge region 250 adjacent to and laterally offset along the second horizontal direction from a respective retro-stepped dielectric material portion (165, 265). The strip portion has a lesser width (i.e., narrower width) than the portions of the electrically conductive layer (146 or 246) located in the first memory array region 100A or in the second memory array region 100B. The portions of the electrically conductive layer (146 or 246) located in the first memory array region 100A or in the second memory array region 100B have a width along the second horizontal direction hd2 that is the same as a lateral distance between a neighboring pair of backside trench fill structures 76. In contrast, each strip portion of the electrically conductive layer (146 or 246) in the bridge region 240 has a width along the second horizontal direction hd2 that is the same as the difference between the lateral distance between a neighboring pair of backside trench fill structures 76 and the width of an adjoining retro-stepped dielectric material portion (165 or 265) along the second horizontal direction hd2. Each electrical connection between a layer contact via structure (86A, 86B) and a most proximal portion of the second memory array region 100B includes a narrow strip portion of an electrically conductive layer (146, 246) in the bridge region 240, while electrical connection between the layer contact via structure (86A, 86B) and a most proximal portion of the first memory array region 100A does not include any narrow strip portion of the electrically conductive layer (146, 246) because the first memory array region 100A is not separated from the layer contact via structures (86A, 86B) by the bridge region 240.

Generally, each of the sidewall of the retro-stepped dielectric material portion (165, 265) laterally extending along the first horizontal direction hd1 has a tapered sidewall such that a bottom portion of each retro-stepped dielectric material portion (165 or 265) has a lesser (i.e., narrower) width than a top portion of each retro-stepped dielectric material portion (166 or 265).

In one embodiment, the alternating stacks {(132, 146), (232, 246)} are laterally spaced apart along the second horizontal direction hd2 by line trenches (such as backside trenches) that laterally extend along the first horizontal direction hd1. The line trenches are filled with line backside trench fill structures 76 having dielectric surfaces (such as surfaces of insulating spacers or dielectric wall structures) that contact sidewalls of the alternating stacks {(132, 146), (232, 246)}. Upon sequentially numbering the line backside trench fill structures 76 with positive integers along the second horizontal direction hd1, odd-numbered line backside trench fill structures contact a respective pair of retro-stepped dielectric material portions (165, 265) (which are located on either side of a respective odd-numbered line backside trench fill structure), and even-numbered line backside trench fill structures do not contact any retro-stepped dielectric material portion (165, 265), or even-numbered line backside trench fill structures contact a respective pair of retro-stepped dielectric material portions (165, 265) and odd-numbered line backside trench fill structures do not contact any retro-stepped dielectric material portion (165, 265).

Figure 2A:
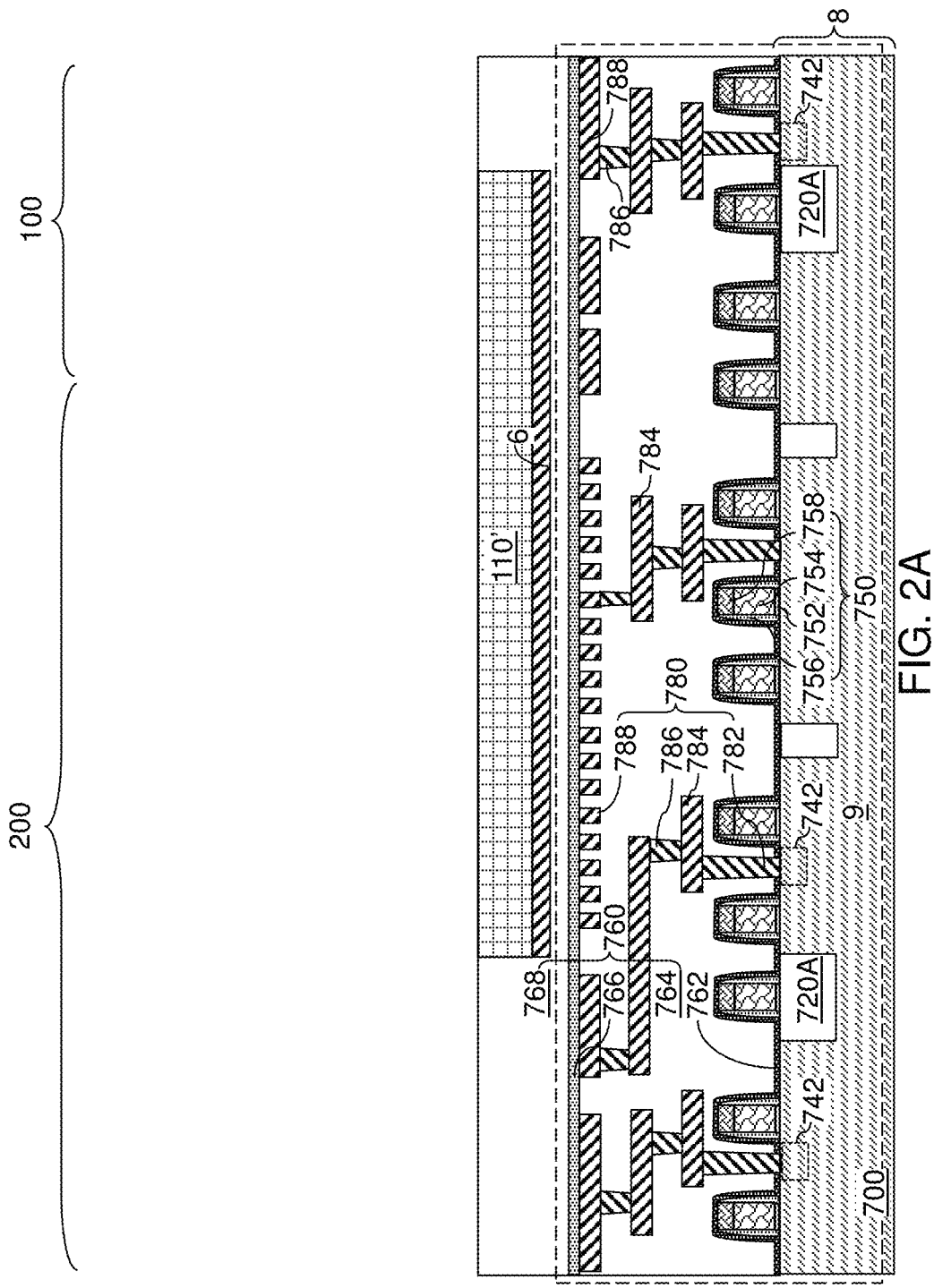
FIG. 2A is a vertical cross-sectional view of an exemplary structure after formation of semiconductor devices, lower level dielectric layers, lower metal interconnect structures, and in-process source level material layers on a semiconductor substrate according to an embodiment of the present disclosure.
Figure 2C:
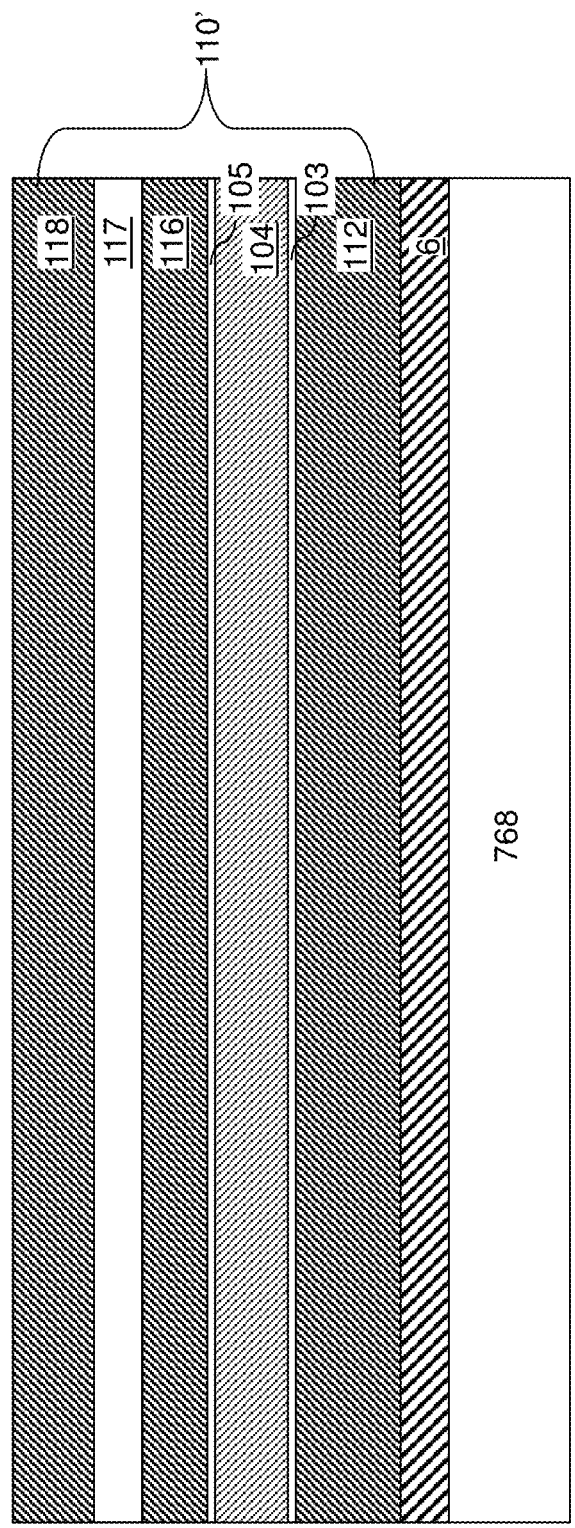
FIG. 2C is a magnified view of the in-process source level material layers along the vertical plane C-C' of FIG. 2B.

Referring to FIGS. 2A-2C, an exemplary structure according to an embodiment of the present disclosure is illustrated, which corresponds to a portion of an in-process semiconductor die that can be subsequently processed to provide the exemplary semiconductor die illustrated in FIGS. 1A-1E. FIG. 2C is a magnified view of an in-process source-level material layers 110' illustrated in FIGS. 2A and 2B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN), a metal silicide, and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region in which contact via structures contacting word line electrically conductive layers are to be subsequently formed. In one embodiment, the staircase region may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 3:
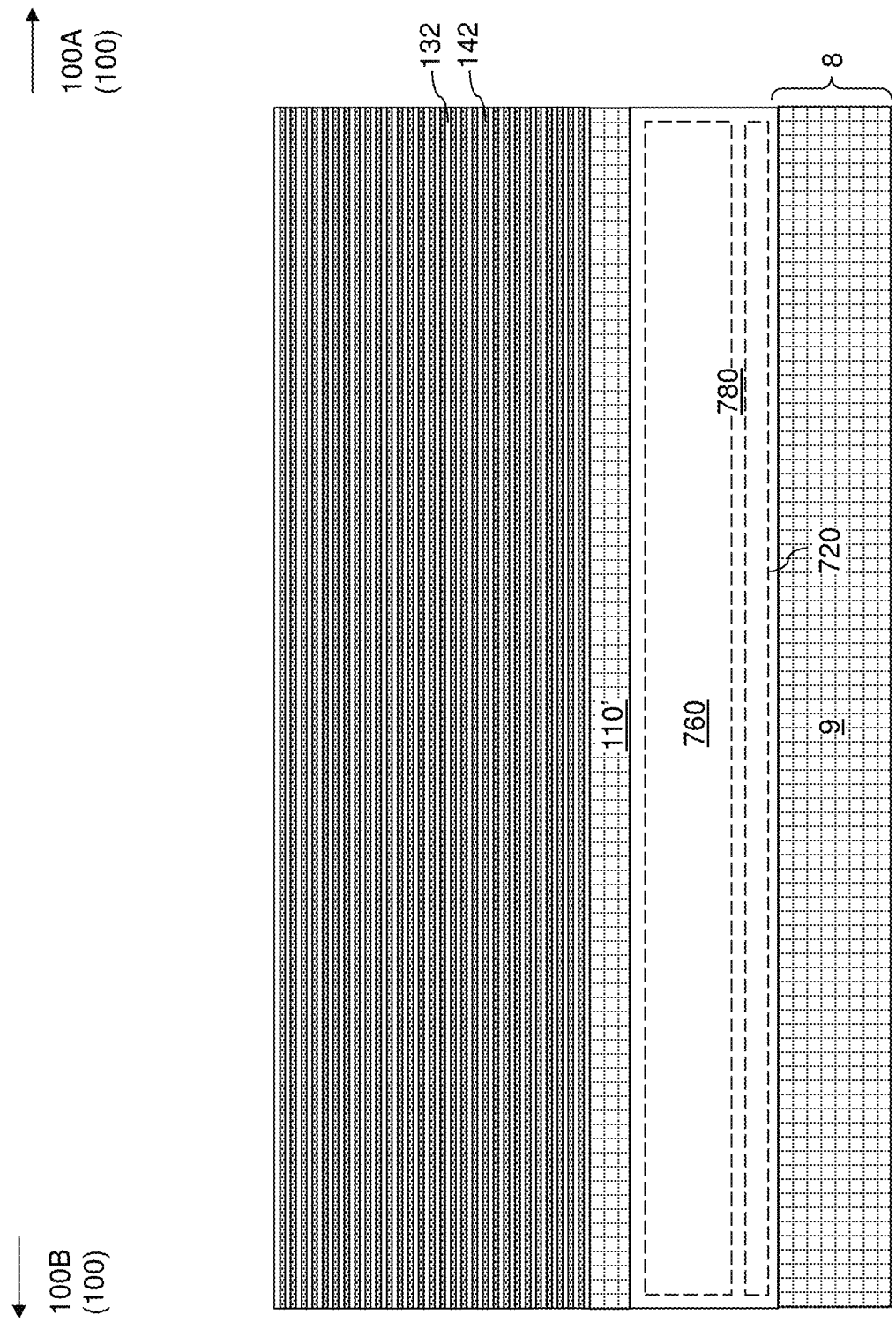
FIG. 3 is a vertical cross-sectional view of the exemplary structure after formation of a first vertically alternating sequence of first insulating layers and first sacrificial material layers according to an embodiment of the present disclosure.

Referring to FIG. 3, a first vertically alternating sequence of first insulating layers 132 and first sacrificial material layers 142 can be formed over the in-process source-level material layers 110'. As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first insulating layers 132 can be composed of the first material, and the first sacrificial material layers 142 can be composed of the second material, which is different from the first material. Each of the first insulating layers 132 is an insulating layer that continuously extends over the entire area of the substrate 8, and may have a uniform thickness throughout. Each of the first sacrificial material layers 142 includes is a sacrificial material layer that includes a dielectric material and continuously extends over the entire area of the substrate 8, and may have a uniform thickness throughout. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a dielectric material, which is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

Generally, a vertically alternating sequence of unit layer stacks over a substrate. Each of the unit layer stacks comprises a first insulating layer (such as a first insulating layer 132) and a first spacer material layer (such as a first sacrificial material layer 142). Generally, the first spacer material layers are formed as, or are subsequently replaced with, first electrically conductive layers. While the present disclosure is described employing an embodiment in which the first spacer material layers are formed as first sacrificial material layers 142 that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

Figure 4A:
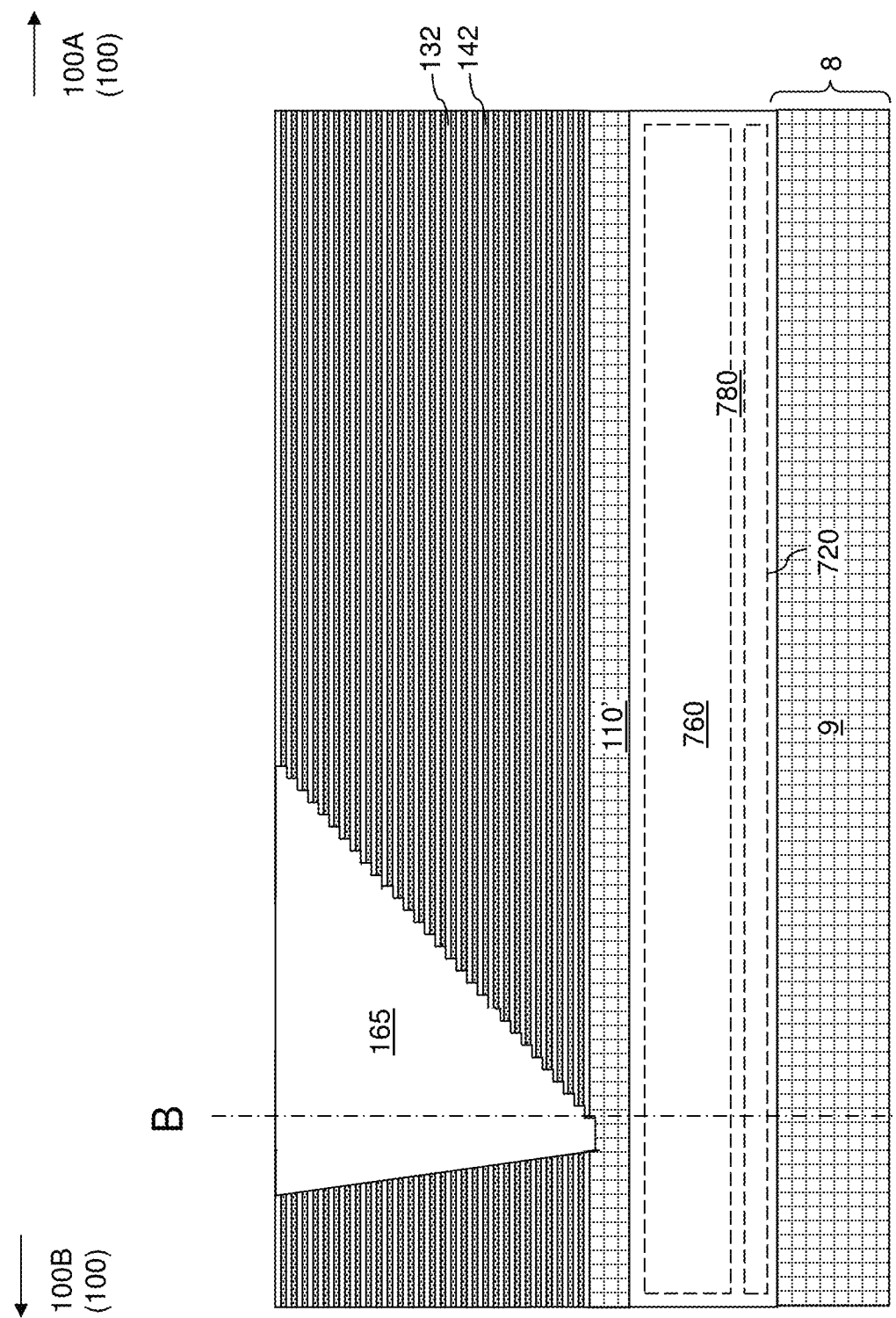
FIG. 4A is a vertical cross-sectional view of the exemplary structure along the first horizontal direction after formation of a first-tier retro-stepped dielectric material portion according to an embodiment of the present disclosure.
Figure 4B:
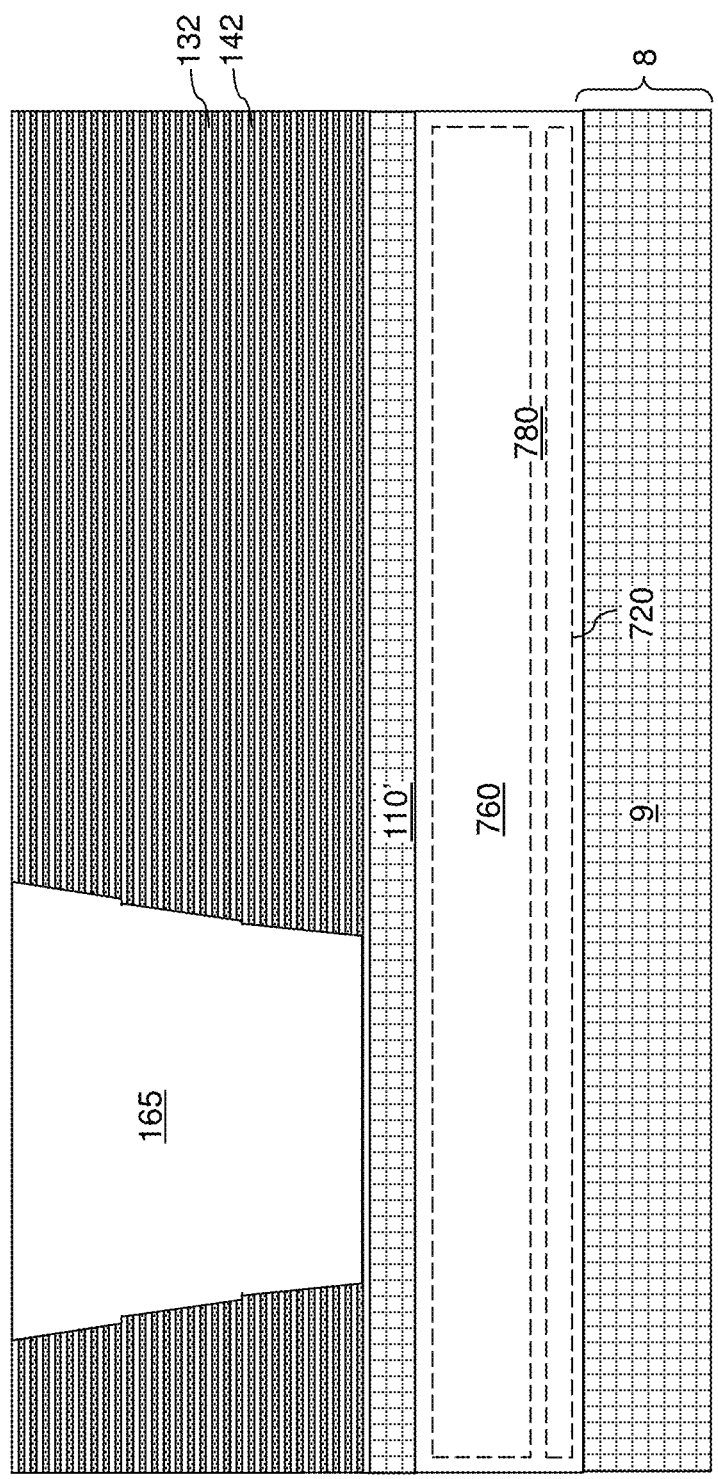
FIG. 4B is a vertical cross-sectional view of the exemplary structure along a vertical plane B-B' of FIG. 4A.

Referring to FIGS. 4A and 4B, first stepped surfaces can be formed within the staircase regions of the inter-array region 200 which will be filled with the first-tier retro-stepped dielectric material portions 165. For example, a combination of a sacrificial hard mask layer and a trimming mask layer may be employed to form the first stepped surfaces. In one embodiment, a row of multiple first staircase regions can be formed within each area that corresponds to a combination of the area of a laterally-neighboring pair of first-tier retro-stepped dielectric material portions 165 and an intervening area. In this case, the multiple first staircase regions can be subsequently vertically offset by different depths by subsequently performing area recess etch processes.

In an illustrative example, $2^M$ sets of first stepped surfaces can be formed within a combination of the area of a laterally-neighboring pair of first-tier retro-stepped dielectric material portions 165 and an intervening area. M can be an integer in a range from 1 to 8. Each set of first stepped staircases may include P steps such that sidewalls of P first continuous spacer material layers are physically exposed with lateral offsets. P may be an integer from 2 to 64. M area recess etch processes can be performed such that each area recess etch process vertically recesses P times $2^i$ sets of a first insulating layer 132 and a first sacrificial material layer 142, in which i is a different integer from 0 to (M−1). A total of up to $2^M \times P$ stepped surfaces can be formed for the first vertically alternating sequence of the first insulating layers 132 and the first sacrificial material layers 142. The total number of the stepped surfaces within each continuous cavity overlying the first stepped surfaces can be the same as the total number of the first sacrificial material layers 142 in the first vertically alternating sequence (132, 142).

A first dielectric fill material (such as undoped silicate glass (i.e., silicon oxide) or a doped silicate glass) can be deposited in each first continuous retro-stepped cavity. The first dielectric fill material can be planarized to remove excess portions of the first dielectric fill material from above the horizontal plane including the topmost surface of the first vertically alternating sequence (132, 142). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in inter-array regions 200 located between a respective first memory array region 100A and a respective second memory array region 100B that are laterally spaced apart along the first horizontal direction hd1.

Figure 5:
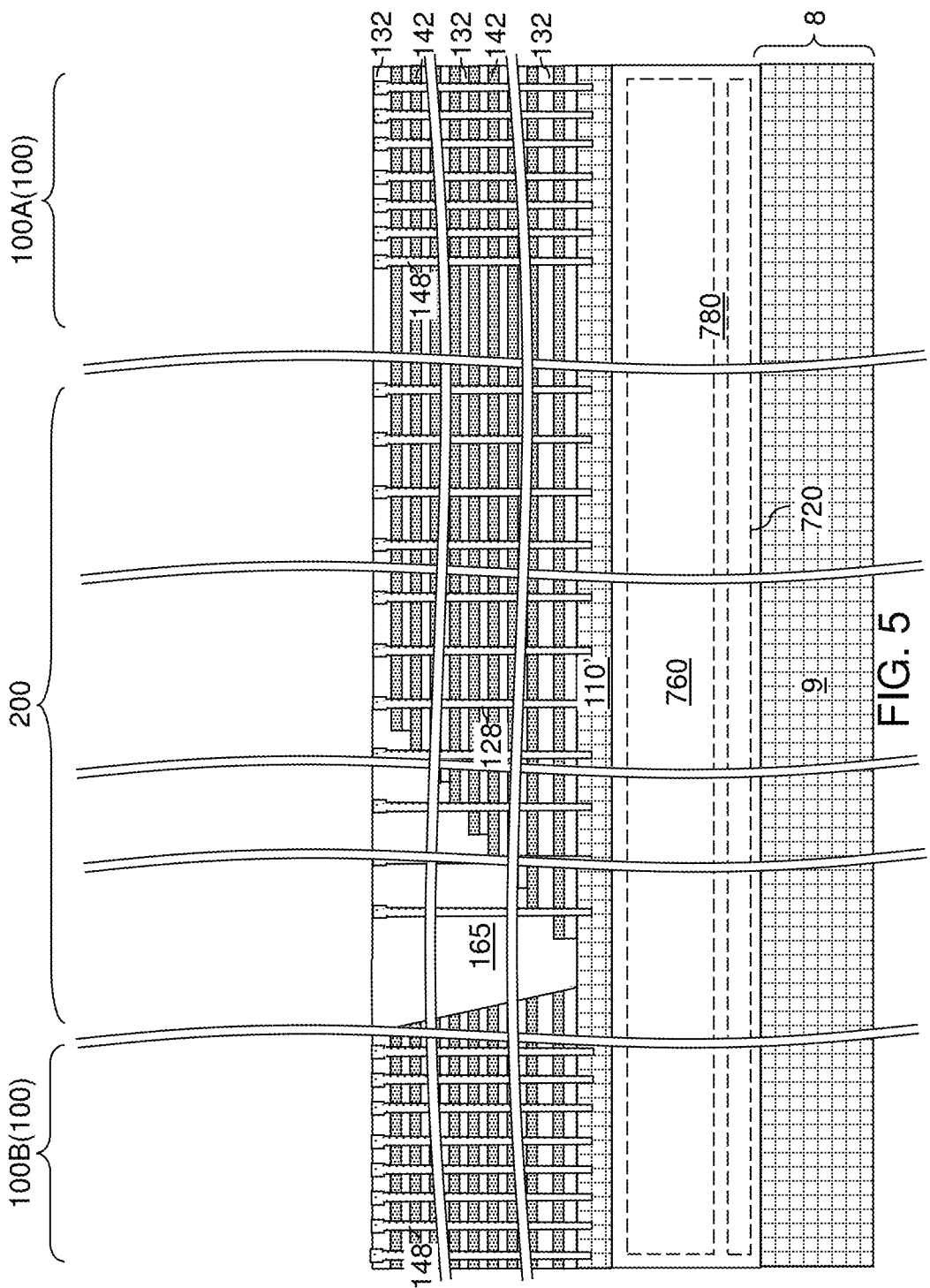
FIG. 5 is a vertical cross-sectional view of the exemplary structure after formation of first-tier openings and sacrificial first-tier opening fill portions according to an embodiment of the present disclosure.

Referring to FIG. 5, various first-tier openings may be formed through the first vertically alternating sequence (132, 142) and into the in-process source-level material layers 110.'. A photoresist layer (not shown) may be applied over the first vertically alternating sequence (132, 142), and may be lithographically patterned to form various openings therethrough. The pattern of openings in the photoresist layer may be transferred through the first vertically alternating sequence (132, 142) and into the in-process source-level material layers 110.' by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132, 142).

Portions of the deposited sacrificial material may be removed from above the topmost layer of the first vertically alternating sequence (132, 142), such as from above the topmost first insulating layer 132. For example, the sacrificial first-tier fill material may be recessed to a top surface of the topmost first insulating layer 132 using a planarization process. The planarization process may include a recess etch, chemical mechanical planarization (CMP), or a combination thereof. The top surface of the topmost first insulating layer 132 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132, 142) (such as from above the top surface of the topmost first insulating layer 132). The top surfaces of the sacrificial first-tier opening fill portions (148, 128) may be coplanar with the top surface of the topmost first insulating layer 132. Each of the sacrificial first-tier opening fill portions (148, 128) may, or may not, include cavities therein. The set of all structures located between the bottommost surface of the first vertically alternating sequence (132, 142) and the topmost surface of the first vertically alternating sequence (132, 142) or embedded within the first vertically alternating sequence (132, 142) constitutes a first-tier structure.

Figure 6:
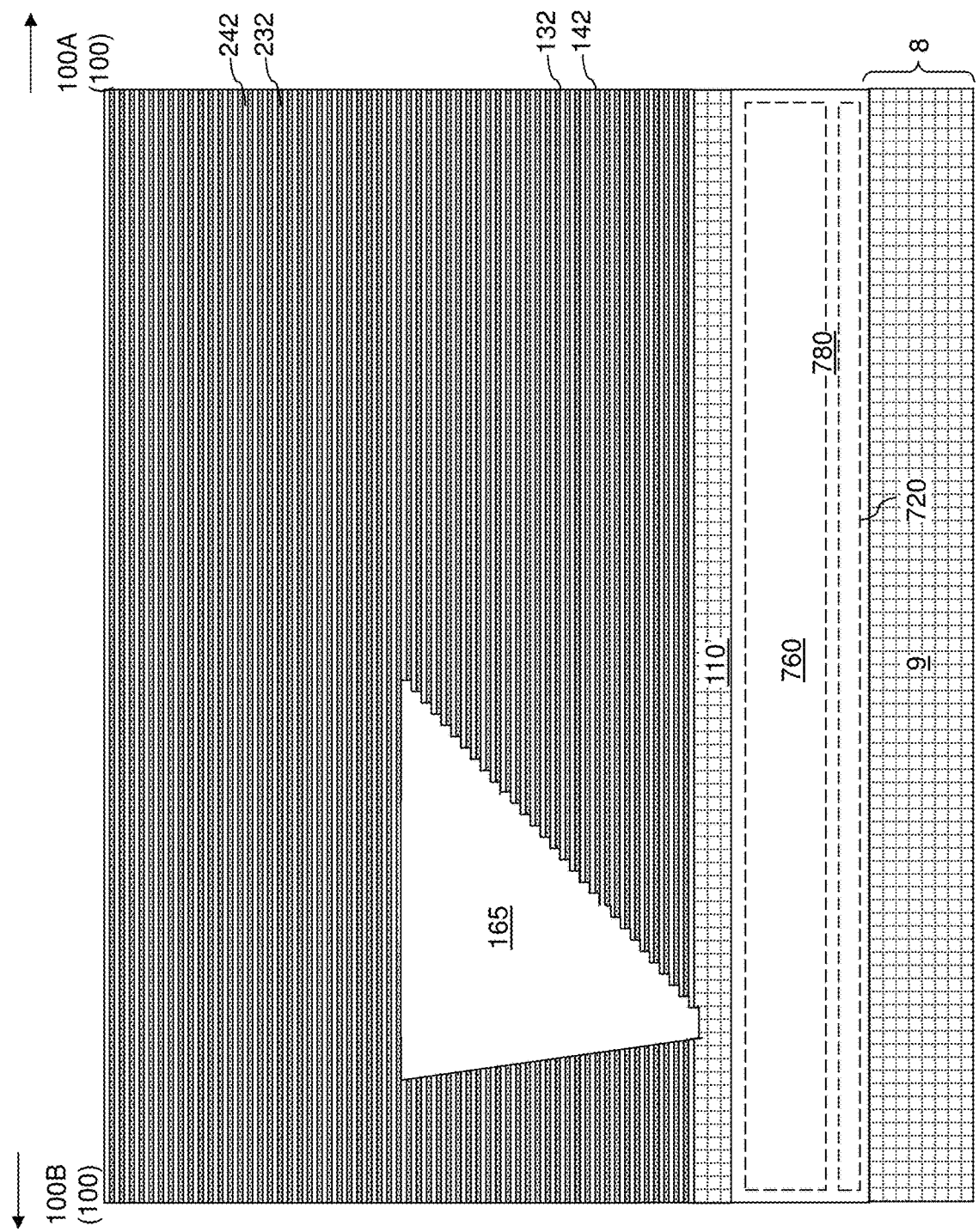
FIG. 6 is a vertical cross-sectional view of the exemplary structure after formation of a second vertically alternating sequence of second insulating layers and second sacrificial material layers according to an embodiment of the present disclosure.

Referring to FIG. 6, a second vertically alternating sequence of second insulating layers 232 and second sacrificial material layers 242 can be formed. Each of the second insulating layers 232 is an insulating layer that continuously extends over the entire area of the substrate 8, and may have a uniform thickness throughout. Each of the second sacrificial material layers 242 includes is a sacrificial material layer that includes a dielectric material and continuously extends over the entire area of the substrate 8, and may have a uniform thickness throughout. The second insulating layers 232 can have the same material composition and the same thickness as the first insulating layers 132. The second sacrificial material layers 242 can have the same material composition and the same thickness as the first sacrificial material layers 142.

Generally, at least one additional vertically alternating sequence of additional insulating layers and additional sacrificial material layers can be optionally formed over the first vertically alternating sequence (132, 142) and the first-tier retro-stepped dielectric material portions 165.

Figure 7B:
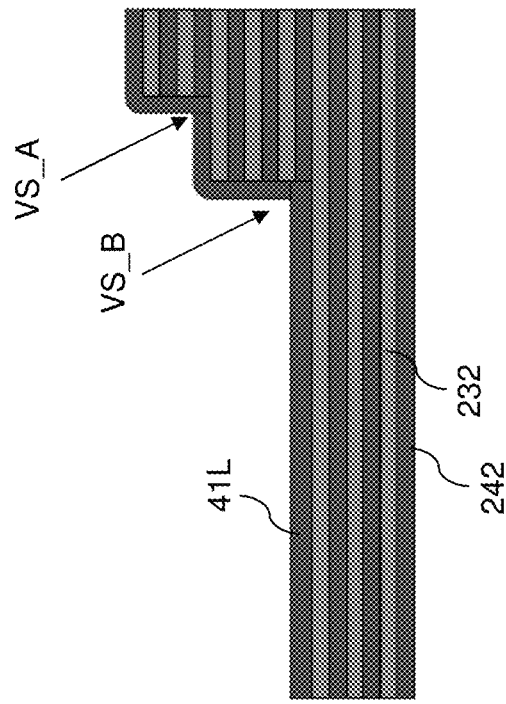
FIGS. 7A-7D are sequential vertical cross-sectional views of an upper region of the second vertically alternating sequence during formation of multi-level vertical steps and sacrificial spacers according to an embodiment of the present disclosure.
Figure 7A:
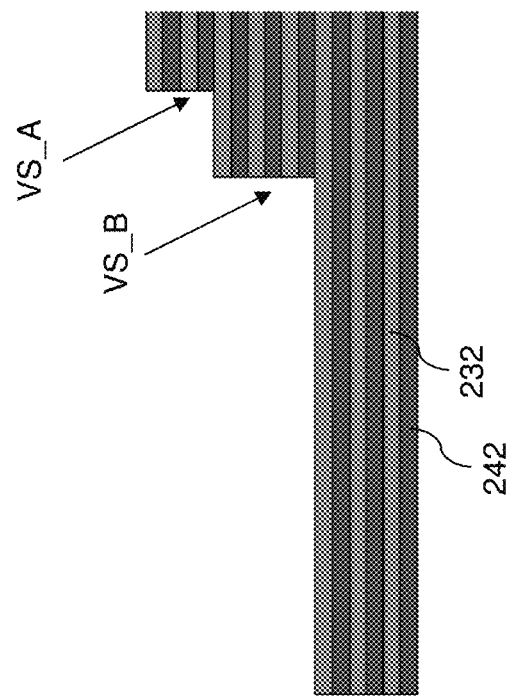

Referring to FIG. 7A, an upper region of the second vertically alternating sequence (232, 242) is illustrated after formation of multi-level vertical steps (VS_A, VS_B) according to an aspect of the present disclosure. In the illustrated example, the multi-level vertical steps (VS_A, VS_B) include a first multi-level vertical step VS_A that is formed by patterning the topmost four layers of the second vertically alternating sequence (232, 242) and a second multi-level vertical step VS_B that is formed by patterning six layers of the second vertically alternating sequence (232, 242) that immediately underlies the four layers of the second vertically alternating sequence (232, 242). The four layers of the second vertically alternating sequence (232, 242) can include a topmost second insulating layers 232, a topmost second sacrificial material layer 242, a second-from-top insulating layer 232 contacting a bottom surface of the topmost second sacrificial material layer 242, and a second sacrificial material layer 242 that contacts the bottom surfaces of the second-from-top insulating layer 232. The six layers of the second vertically alternating sequence (232, 242) comprise a contiguous set of three second insulating layers 232 and three second sacrificial material layers 242 that immediately underlie the four layers of the second vertically alternating sequence (232, 242). Generally, at least one multi-level vertical step (VS_A, VS_B) including vertically coincident sidewalls of a respective contiguous set of 2K second insulating layers 232 and 2K second sacrificial material layers 242 can be formed by patterning uppermost layers of the second vertically alternating sequence (232, 242). K is an integer greater than 1, and may be 2, 3, 4, 5, etc. While two multi-level vertical step (VS_A, VS_B) are shown, there may be only one multi-level vertical step or three or more multi-level vertical steps. A vertical plane includes sidewalls of each layer within the respective contiguous set of 2K second insulating layers 232 and 2K second sacrificial material layers 242. Generally, the number K is the total number of a respective set of drain-select-level electrically conductive layers to be subsequently electrically shorted.

The multi-level vertical steps (VS_A, VS_B) may be formed, for example, by forming a patterned hard mask layer (not shown) that may be employed as an etch mask layer over the second vertically alternating sequence (232, 242). The patterned hard mask layer can be patterned to form an opening within each area in which a second retro-stepped dielectric material portion 265 illustrated in FIGS. 1A-1E is to be subsequently formed. In one embodiment, the patterned hard mask layer may comprise a metal hard mask layer or a dielectric (e.g., metal oxide) hard mask layer. A photoresist layer (not shown) can be applied over the second vertically alternating sequence (232, 242) and the patterned hard mask layer, and can be lithographically patterning to form edges that laterally extend along the second horizontal direction hd2 over each area of the second retro-stepped dielectric material portions 265 to be subsequently formed. An anisotropic etch process can be performed to etch through two or more pairs of a second insulating layer 232 and a second sacrificial material layer 242. A first set of multi-level vertical steps such as the first multi-level vertical steps VS_B can be formed. Optionally, the photoresist layer may be trimmed, or another photoresist layer may be applied and patterned after removal of the photoresist layer, to provide additional edges of a patterned photoresist layer that are laterally offset from the first multi-level vertical steps VS_B. Another anisotropic etch process can be performed to form a second set of multi-level vertical steps, such as the second multi-level vertical steps VS_B. The photoresist layer can be subsequently removed, for example, by ashing. Generally, at least one multi-level vertical step (VS_A, VS_B) can be formed by patterning a vertically alternating sequence, such as the second vertically alternating sequence (232, 242). In case only a single vertically alternating sequence is employed instead of the combination of a first vertically alternating sequence (132, 242) and a second vertically alternating sequence (232, 242), the at least one multi-level vertical step (VS_A, VS_B) can be formed by patterning the single vertically alternating sequence. Each of the at least one multi-level vertical step (VS_A, VS_B) comprises vertically coincident sidewalls of two or more insulating layers and two or more sacrificial material layers within the vertically alternating sequence.

Referring to FIG. 7B, a sacrificial material liner 41L can be conformally deposited over the at least one multi-level vertical step (VS_A, VS_B) and physically exposed horizontal surfaces of the second vertically alternating sequence (232, 242). In one embodiment, the sacrificial material liner 41L comprises, and/or consists essentially of, a same material as the second sacrificial material layers 242. In one embodiment, the first sacrificial material layers 142, the second sacrificial material layers 242, and the sacrificial material liner 41L may comprise, and/or consist essentially of, a same sacrificial material, such as silicon nitride. The thickness of the sacrificial material liner 41L may be the same as, may be greater than, or may be less than, the thickness of each of the second sacrificial material layers 242. In one embodiment, the thickness of the sacrificial material liner may 41L be in a range from 10 nm to 100 nm, such as from 20 nm to 50 nm, although lesser and greater thicknesses may also be employed.

Figure 7C:
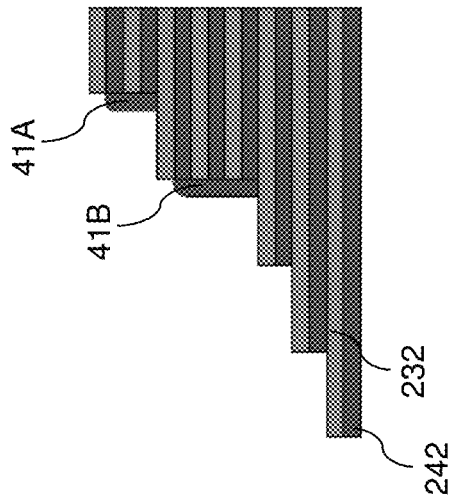
Figure 7D:
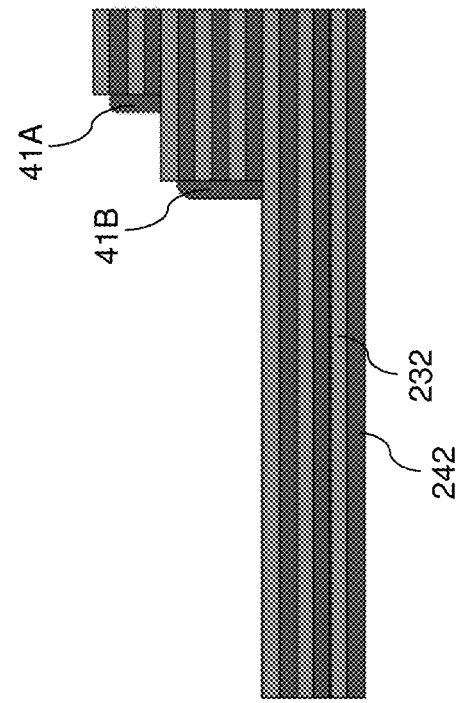

Referring to FIG. 7C, an anisotropic etch process (such as a reactive sidewall spacer ion etch process) can be performed to remove horizontally-extending portions of the sacrificial material liner 41L. Remaining vertically-extending portions of the sacrificial material liner comprise at least one sacrificial spacer (41A, 41B). In an illustrative example, the at least one sacrificial spacer (41A, 41B) may comprise a first sacrificial spacer 41A that is formed on the vertical sidewall of the first multi-level vertical step VS_A and a second sacrificial spacer 41B that is formed on the vertical sidewall of the second multi-level vertical step VS_B. Generally, at least one sacrificial spacer (41A, 41B) can be formed on the vertical sidewall of each of the at least one multi-level vertical step (VS_A, VS_B).

Figure 8B:
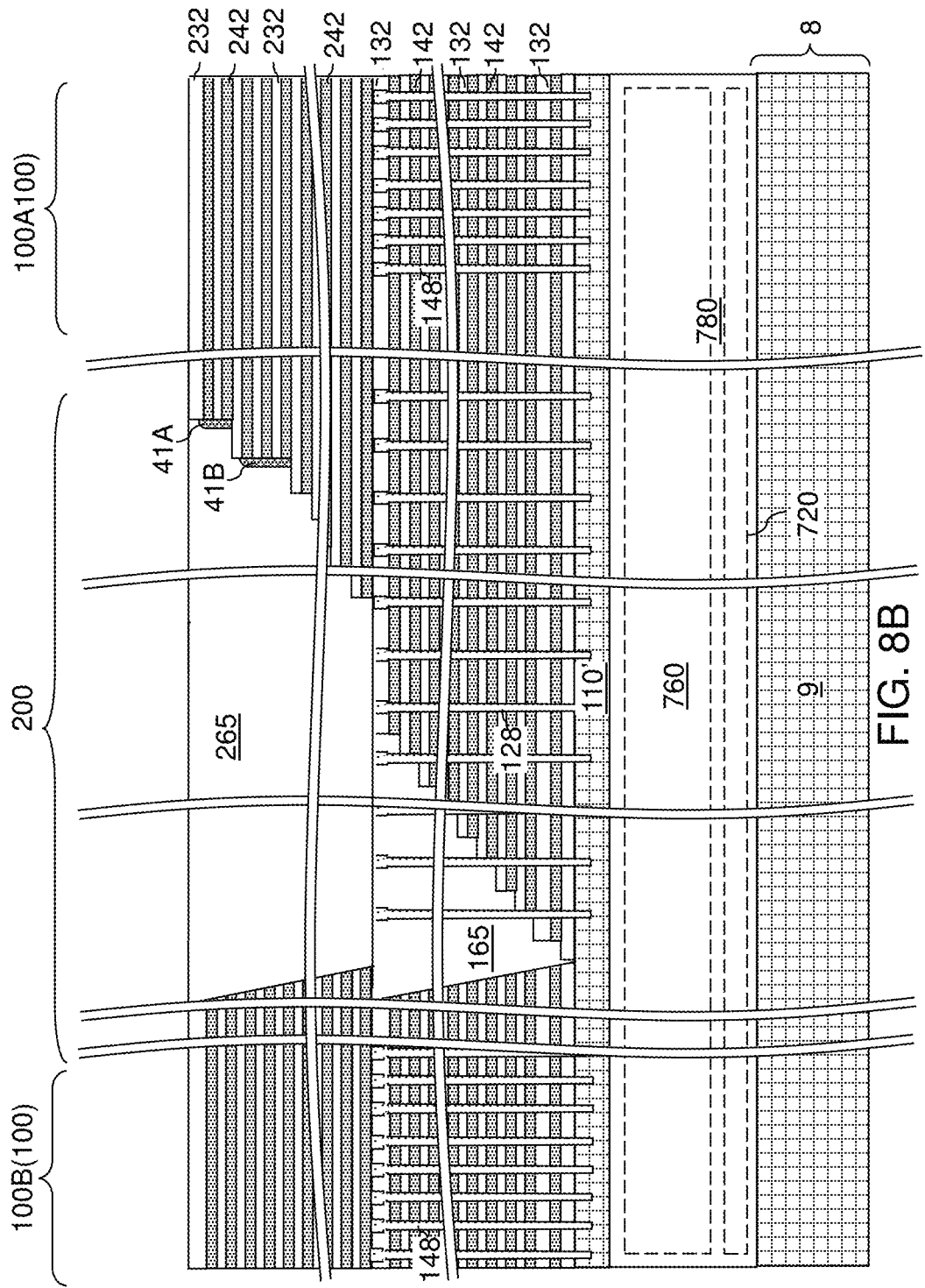
FIG. 8B is another vertical cross-sectional view of the exemplary structure at the processing steps of FIGS. 8A and 8B.

Referring to FIGS. 8A and 8B, single-level vertical steps can be formed through the set of layers within the second vertically alternating sequence (232, 242) that underlie the set of layers that are patterned with the at least one multi-level vertical step (VS_A, VS_B). Thus, the second vertically alternating sequence (232, 242) can be patterned at each level that is different from levels including the at least one multi-level vertical step (VS_A, VS_B). As used herein, a single-level vertical step refers to a vertical step that vertically extends through only a single insulating layer (such as a single second insulating layer 232) and a single sacrificial material layer (such as a single second sacrificial material layer 242).

Second stepped surfaces may be formed in the second stepped area of each staircase region using a same set of processing steps as the processing steps used to form the first stepped surfaces in the first stepped area with suitable adjustment to the pattern of at least one masking layer. For example, a trimming mask layer may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes.

In an illustrative example, $2^N$ sets of second stepped surfaces can be formed within a combination of the area of a laterally-neighboring pair of second-tier retro-stepped dielectric material portions 265 and an intervening area. N can be an integer in a range from 2 to 8. Each set of second stepped staircases may include P steps such that sidewalls of Q second continuous spacer material layers are physically exposed with lateral offsets. Q may be an integer from 2 to 64. M area recess etch processes can be performed such that each area recess etch process vertically recesses Q times $2^j$ sets of a second insulating layer 232 and a second sacrificial material layer 242, in which j is a different integer from 0 to (N−1). A total of up to $2^N \times Q$ stepped surfaces can be formed for the second vertically alternating sequence of the second insulating layers 232 and the second sacrificial material layers 242. The total number of the stepped surfaces within each continuous cavity overlying the second stepped surfaces can be the same as the total number of the second sacrificial material layers 242 in the second vertically alternating sequence (132, 242).

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232, 242). Each remaining portion of the second dielectric fill material that fills a respective second continuous retro-stepped cavity constitutes a second-tier retro-stepped dielectric material portion 265. The patterned hard mask layer can be subsequently removed employing a selective etch process that etches the material of the patterned hard mask layer selective to the materials of the second-tier retro-stepped dielectric material portions 265 and the second insulating layers 232.

A second-tier structure is provided, which comprises a second vertically alternating sequence of second insulating layers 232 and second sacrificial material layers 242 and second-tier retro-stepped dielectric material portions 265 overlying second stepped surfaces of the second vertically alternating sequence that are located in the inter-array regions 200. Generally, a retro-stepped dielectric material portion (such as a second-tier retro-stepped dielectric material portion 265) can be formed over the single-level vertical steps of a vertically alternating sequence (such as the second vertically alternating sequence) and the at least one multi-level vertical step (VS_A, VS_B).

Figure 9:
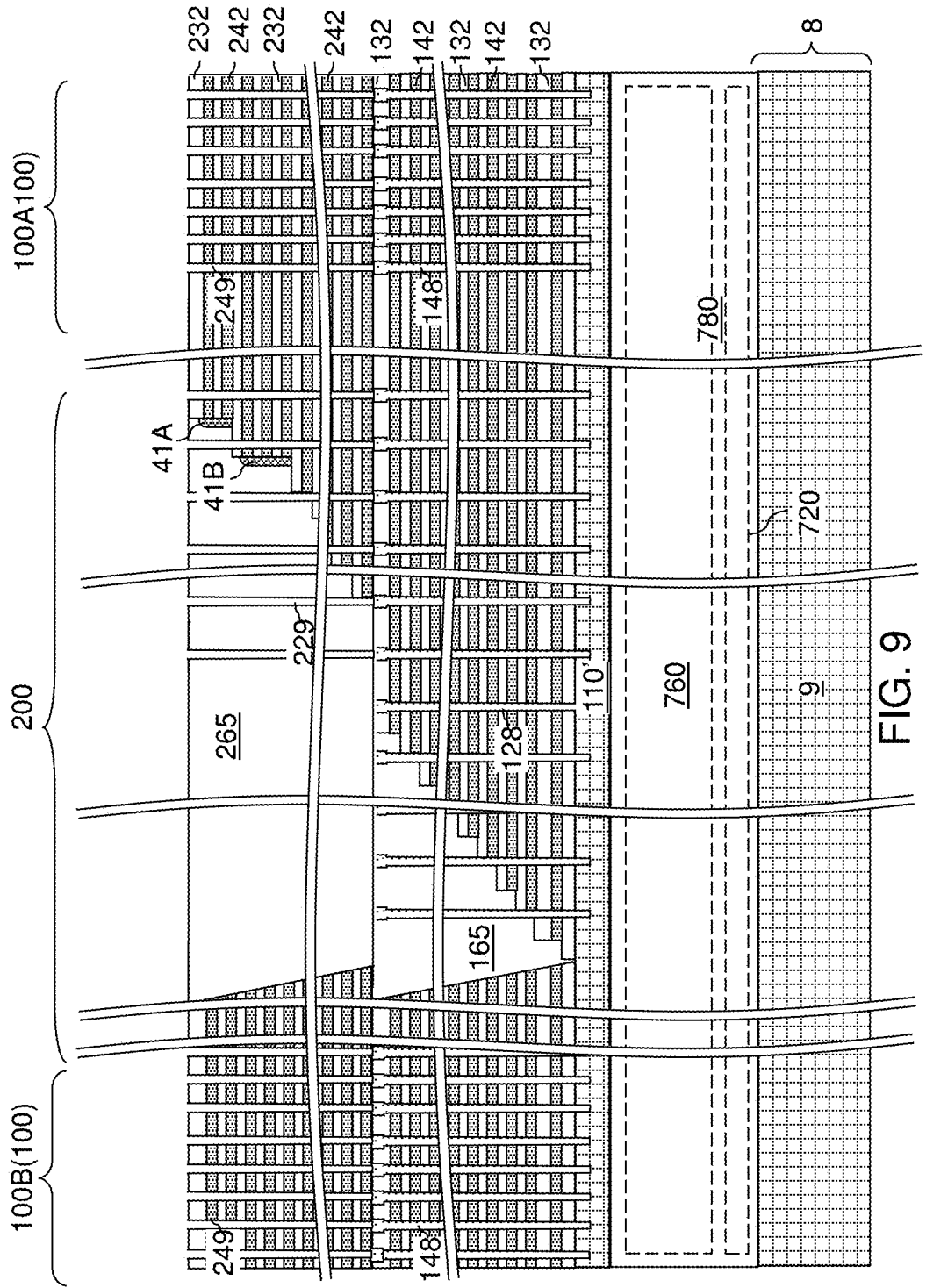
FIG. 9 is a vertical cross-sectional view of the exemplary structure after formation of second-tier openings through the second vertically alternating sequence according to an embodiment of the present disclosure.

Referring to FIG. 9, various second-tier openings (249, 229) may be formed through the second vertically alternating sequence (232, 242) and over the sacrificial first-tier opening fill portions (148, 128). A photoresist layer (not shown) may be applied over the second vertically alternating sequence (232, 242), and may be lithographically patterned to form various openings therethrough. The pattern of openings in the photoresist layer may be transferred through the second vertically alternating sequence (232, 242) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

Figure 10:
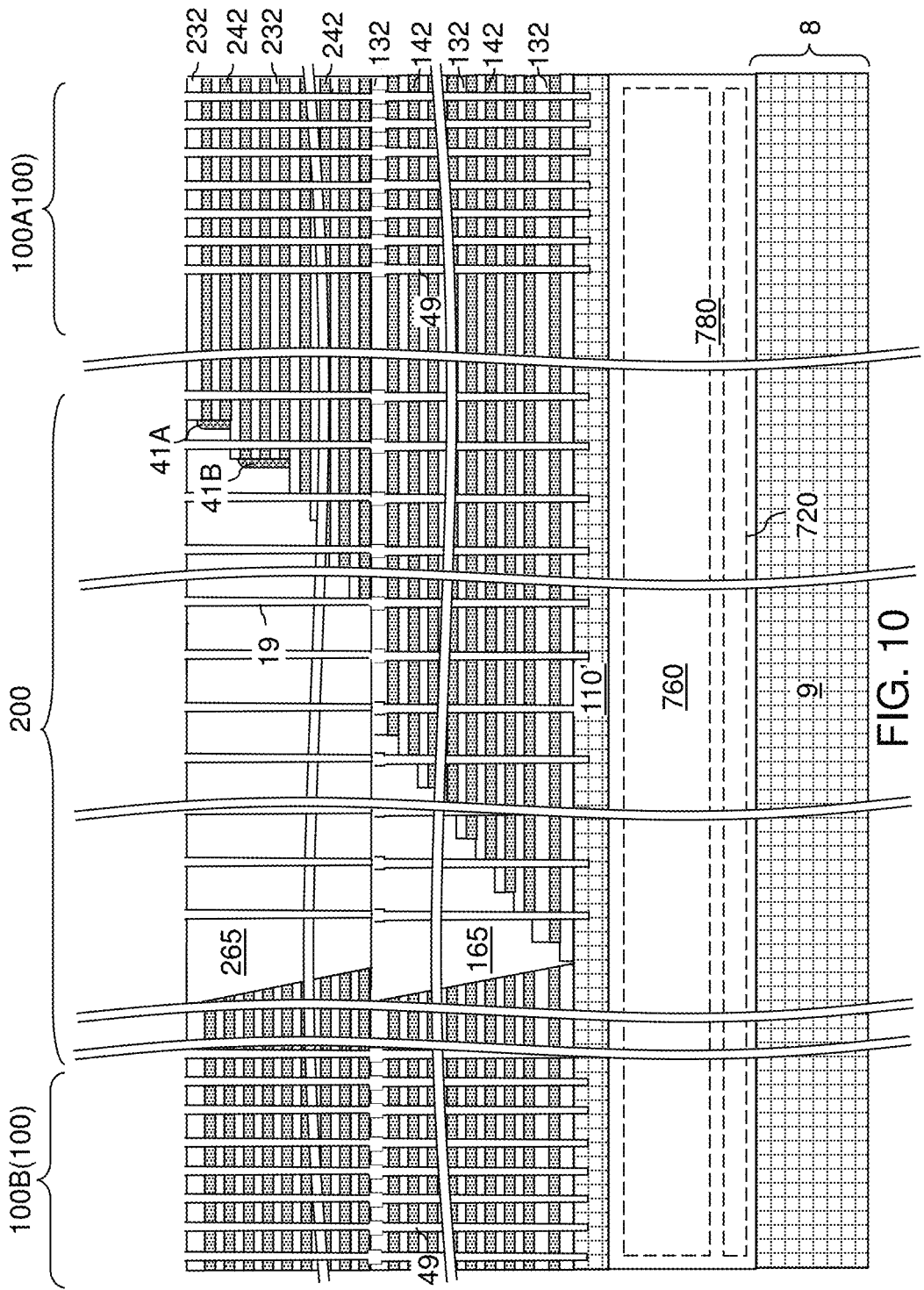
FIG. 10 is a vertical cross-sectional view of the exemplary structure after formation of inter-tier memory openings and inter-tier support openings according to an embodiment of the present disclosure.

Referring to FIGS. 10 and 11A, the sacrificial first-tier fill material of the sacrificial first-tier opening fill portions (148, 128) may be removed using an etch process that etches the sacrificial first-tier fill material selective to the materials of the first and second insulating layers (132, 232) and the first and second sacrificial material layers (142, 242) and the in-process source-level material layers 110'. A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132, 142) and each layer within the second vertically alternating sequence (232, 242) are present.

Referring to FIG. 11B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 11C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second insulating layer 232 may be removed, for example, by a recess etch. The recess etch continues until top surfaces of the remaining portions of the dielectric core layer are recessed to a height between the top and bottom surfaces of the topmost second insulating layer 232. Each remaining portion of the dielectric core layer constitutes a dielectric core 62.

Figure 12:
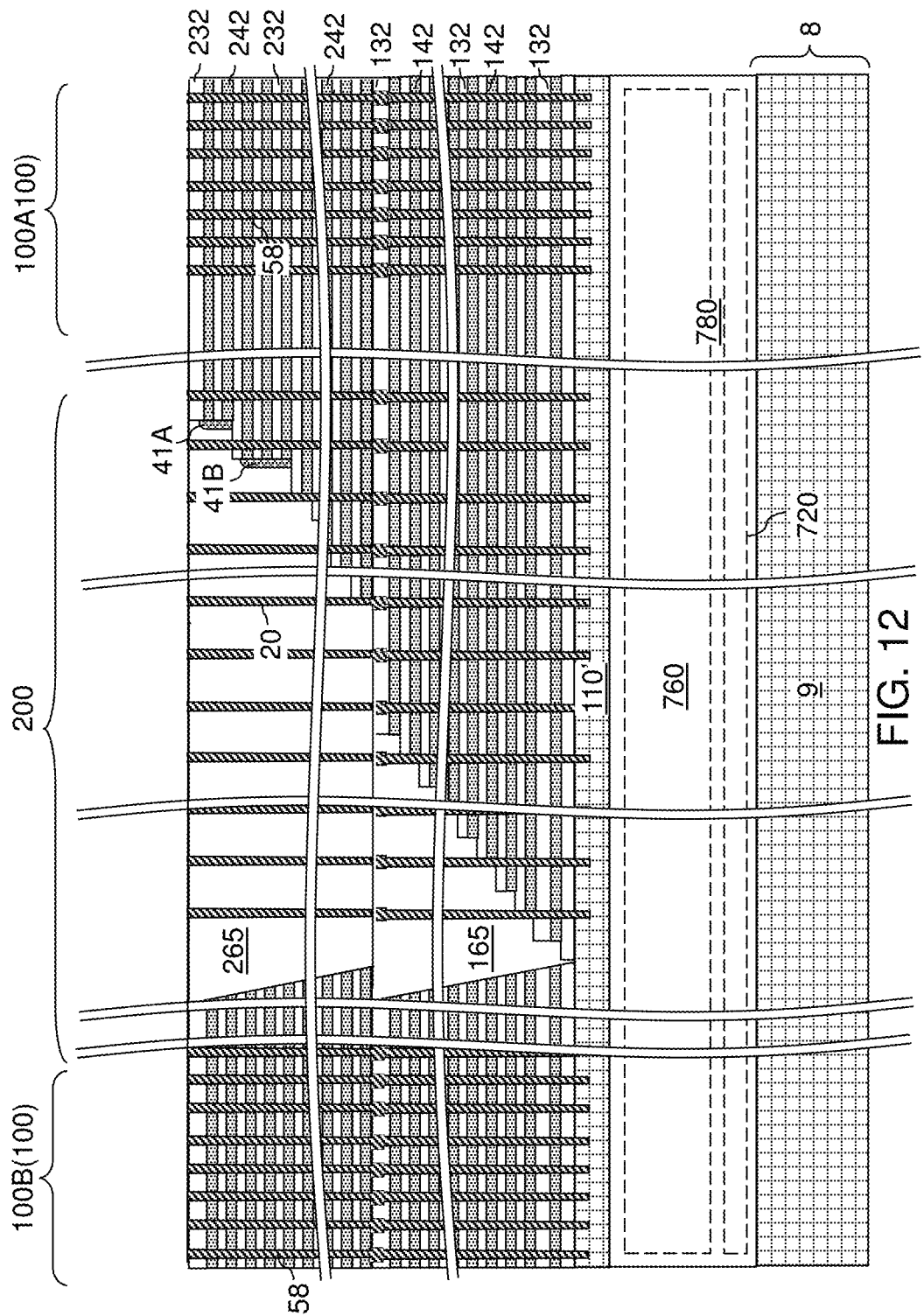
FIG. 12 is a schematic vertical cross-sectional view of the exemplary structure at the processing steps of FIG. 11D according to an embodiment of the present disclosure.

Referring to FIGS. 11D and 12, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second insulating layer 232 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a charge storage layer 54 located at levels of the sacrificial material layers (142, 242)) and a vertical semiconductor channel 60 that vertically extend through the sacrificial material layers (142, 242) adjacent to the respective vertical stack of memory elements.

Each inter-tier support opening can be filled with a respective set of material portions having the same material composition as a corresponding component in a memory opening fill structure 58 during the processing steps of FIGS. 11B-11D. Each set of material portions filling an inter-tier support opening is herein referred to as a support pillar structure 20. It is noted that the support pillar structures 20 are not illustrated in FIGS. 1A-1E for the purpose of clarity. The in-process source-level material layers 110', the first-tier structure (132, 142, 165), the second-tier structure (232, 242, 265), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through the second vertically alternating sequence (232, 242), a first-tier retro-stepped dielectric material portion 165, and a portion of the first vertically alternating sequence (132, 142) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232, 242) that underlies the second-tier retro-stepped dielectric material portion 265, and each layer within the first vertically alternating sequence (132, 142).

Figure 13:
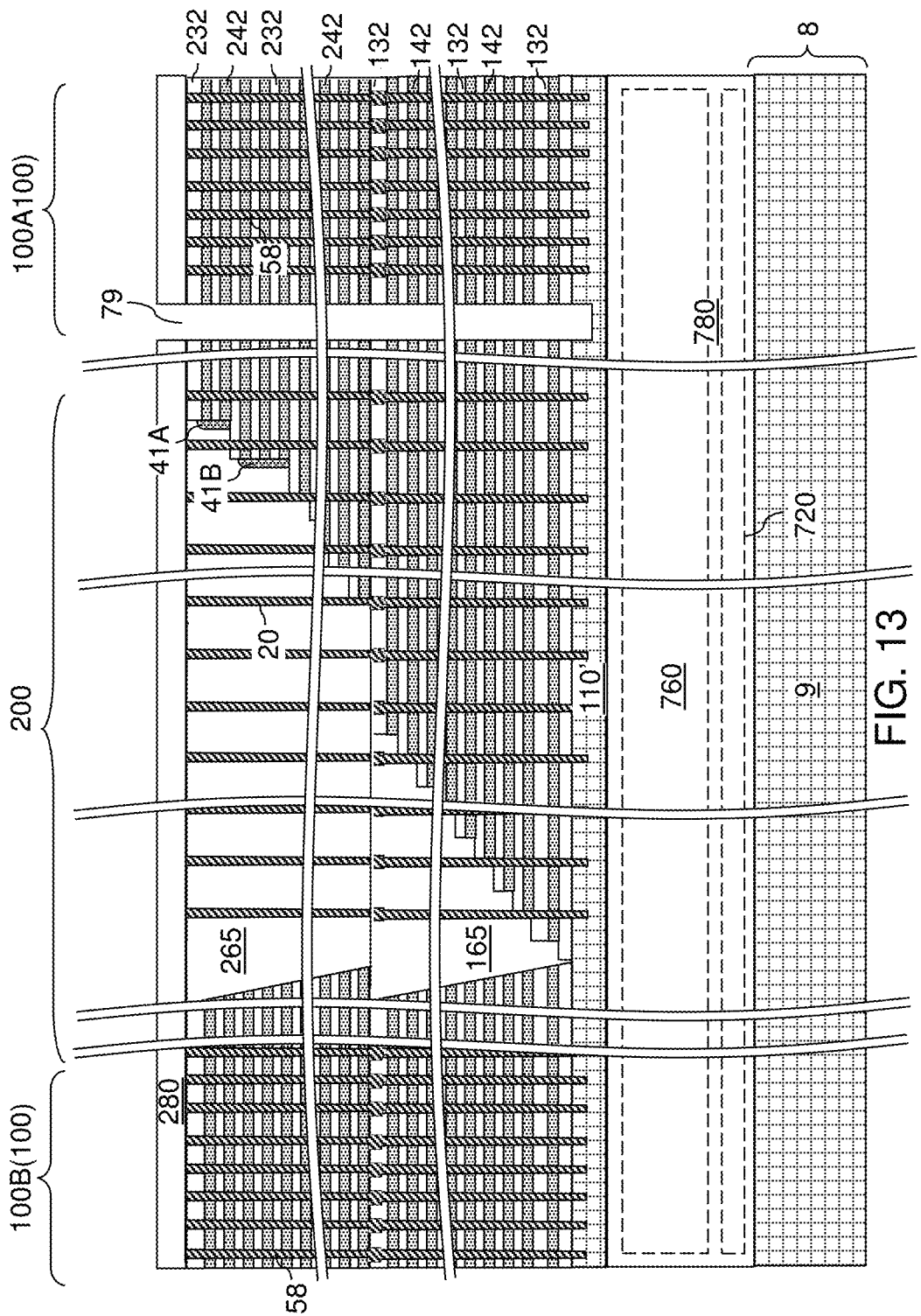
FIG. 13 is a schematic vertical cross-sectional view of the exemplary structure after formation of a contact-level dielectric layer and backside trenches according to an embodiment of the present disclosure.

Referring to FIG. 13, a contact-level dielectric layer 280 may be formed over the second vertically alternating sequence (232, 242). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the backside trench fill structures 76 illustrated in FIGS. 1A-1E. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232, 242, 265), and the first-tier structure (132, 142, 165), and into the in-process source-level material layers 110'. The pattern of the backside trenches 79 can be identical to the pattern of the backside trench fill structures 76 illustrated in FIGS. 1A-1E. Portions of the contact-level dielectric layer 280, the second-tier structure (232, 242, 265), the first-tier structure (132, 142, 165), and the in-process source-level material layers 110' that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232, 242) and the first vertically alternating sequence (132, 142) without etching through the first-tier retro-stepped dielectric material portions 165 or the second-tier retro-stepped dielectric material portions 265. Every even-numbered backside trench 79 can extend through the second vertically alternating sequence (232, 242) and the first vertically alternating sequence (132, 142) and cut through a respective first-tier retro-stepped dielectric material portion 165 and a respective second-tier retro-stepped dielectric material portion 265.

Each vertically alternating sequence {(132, 142), (232, 242)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through am inter-array region 200 and a pair of memory array regions 100 that are adjoined to inter-array region 200. Further, each backside trench 79 can vertically extend through an entire thickness of the vertically alternating sequences {(132, 142), (232, 242)}. Each patterned portion of the first vertically alternating sequence (132, 142) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232 and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

Figure 14A:
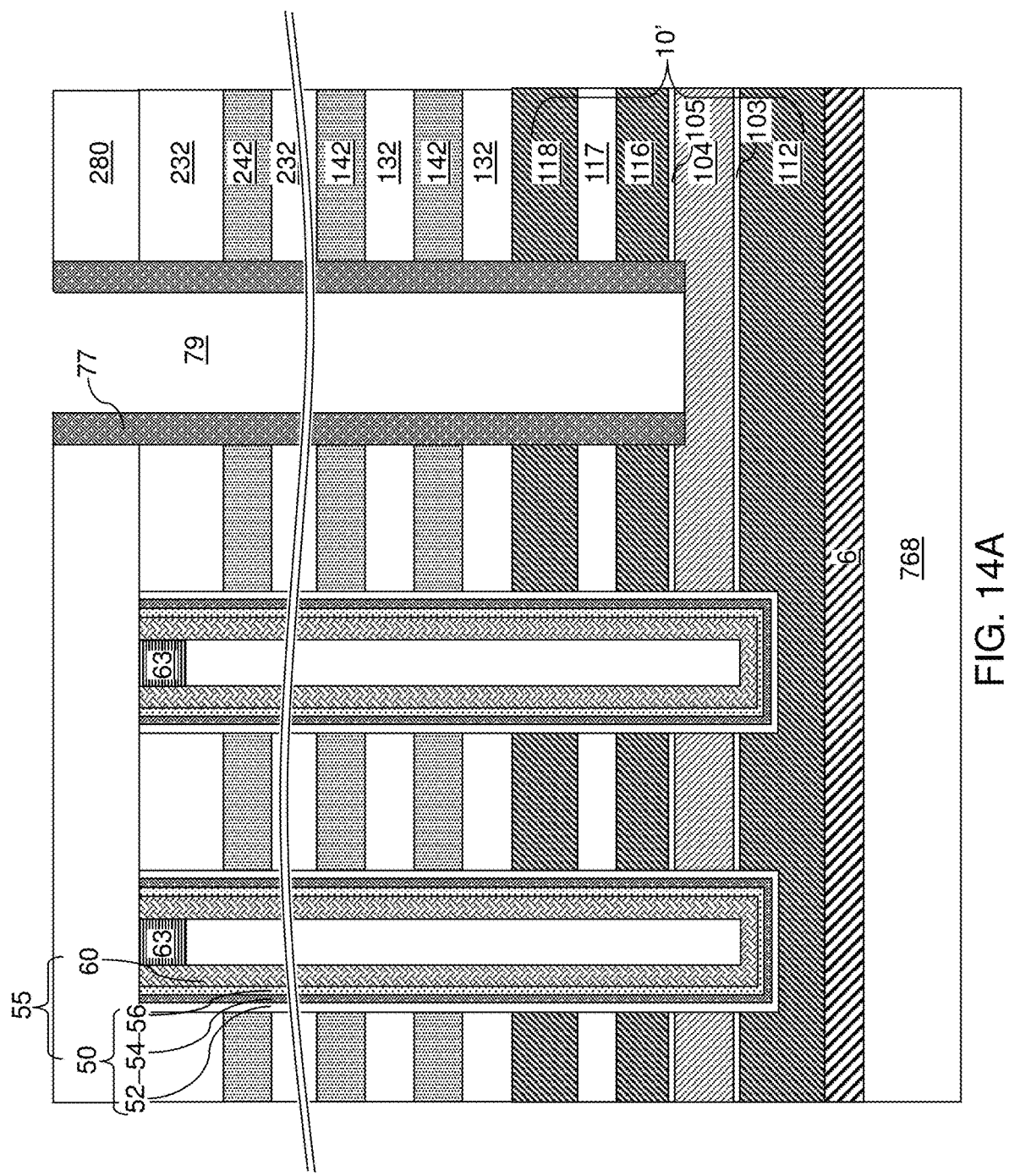
FIGS. 14A-14E illustrate sequential vertical cross-sectional views of memory opening fill structures and a backside trench during formation of source-level material layers according to an embodiment of the present disclosure.

Referring to FIG. 14A, a backside trench spacer 77 may be formed on sidewalls of each backside trench 79. For example, a conformal spacer material layer may be deposited in the backside trenches 79 and over the contact-level dielectric layer 80, and may be anisotropically etched to form the backside trench spacers 77. The backside trench spacers 77 include a material that is different from the material of the source-level sacrificial layer 104. For example, the backside trench spacers 77 may include silicon nitride.

Figure 14B:
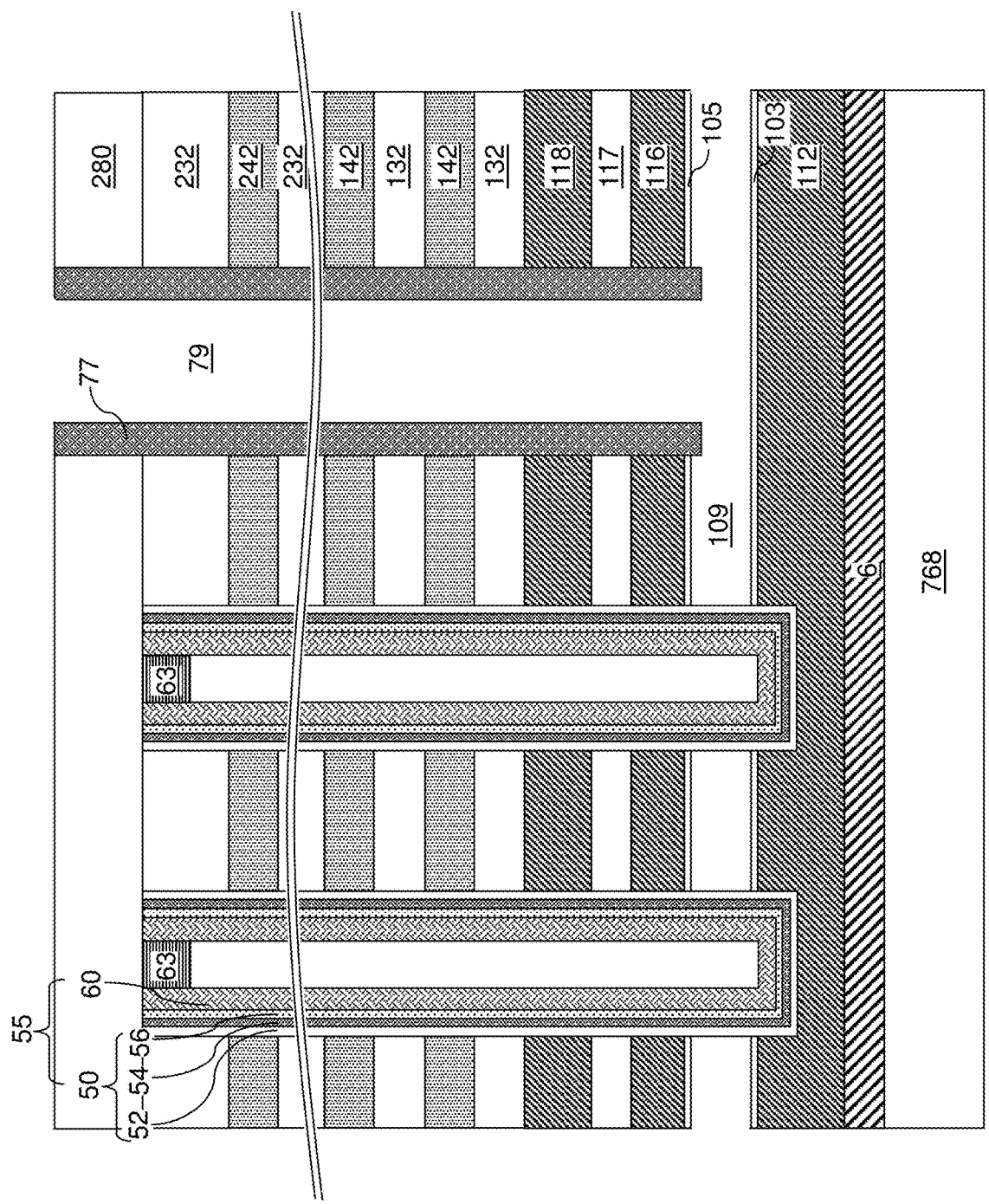

Referring to FIG. 14B, an etchant that etches the material of the source-level sacrificial layer 104 selective to the materials of the alternating stacks {(132, 142), (232, 242)}, the contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH)

may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 14C:
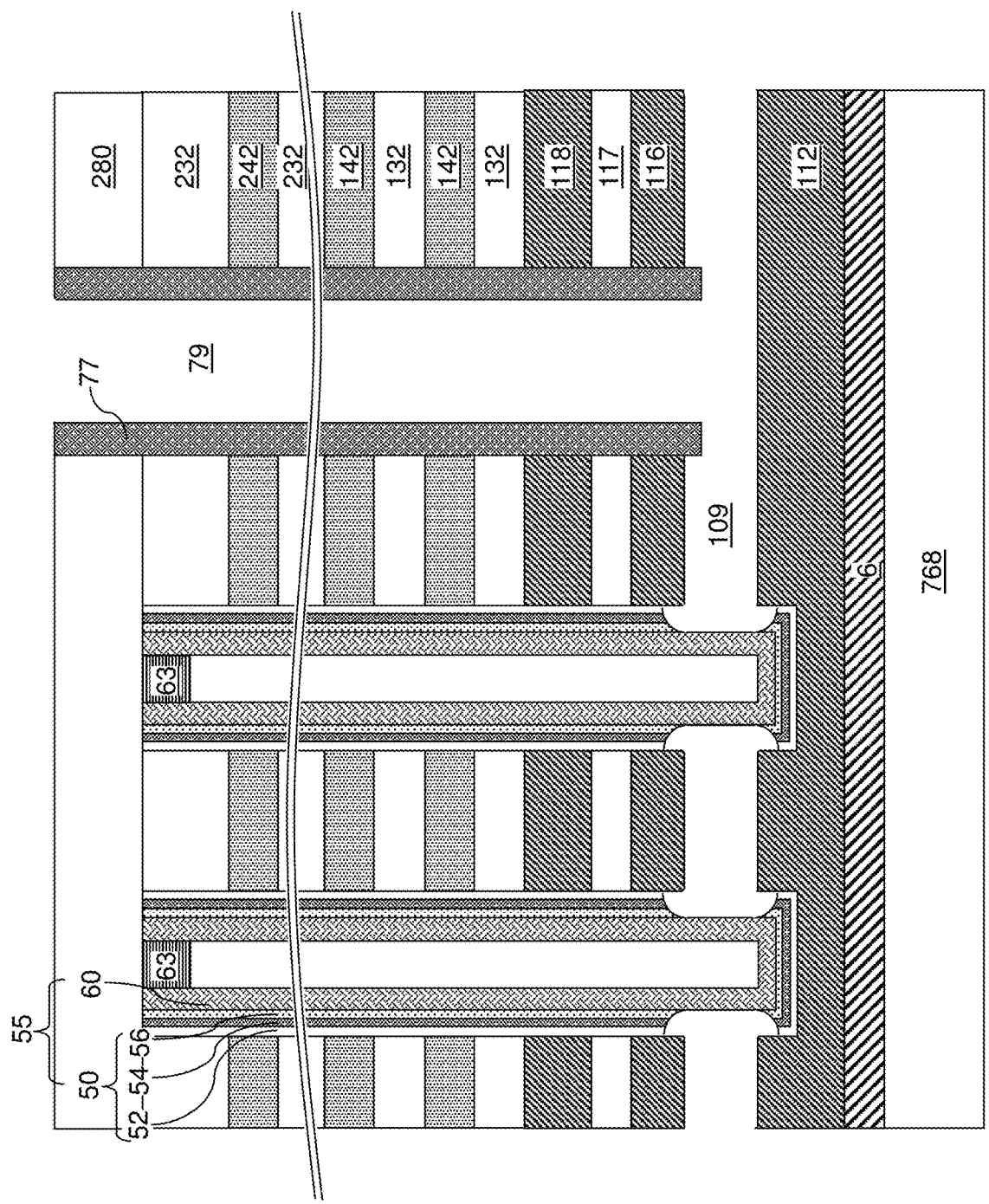

Referring to FIG. 14C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 14D:
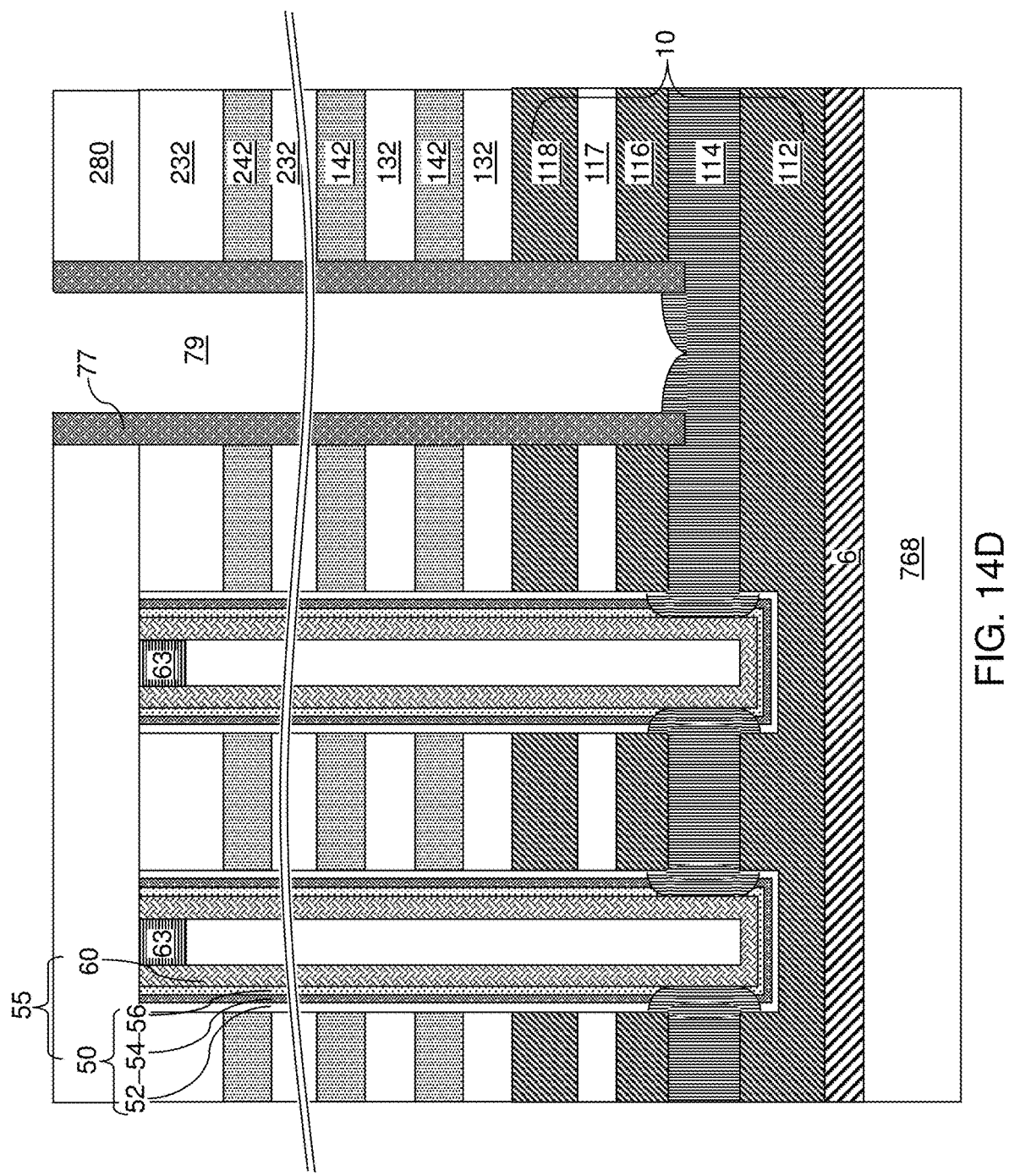

Referring to FIG. 14D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 10, which replaces the in-process source-level material layers 10'.

Figure 14E:
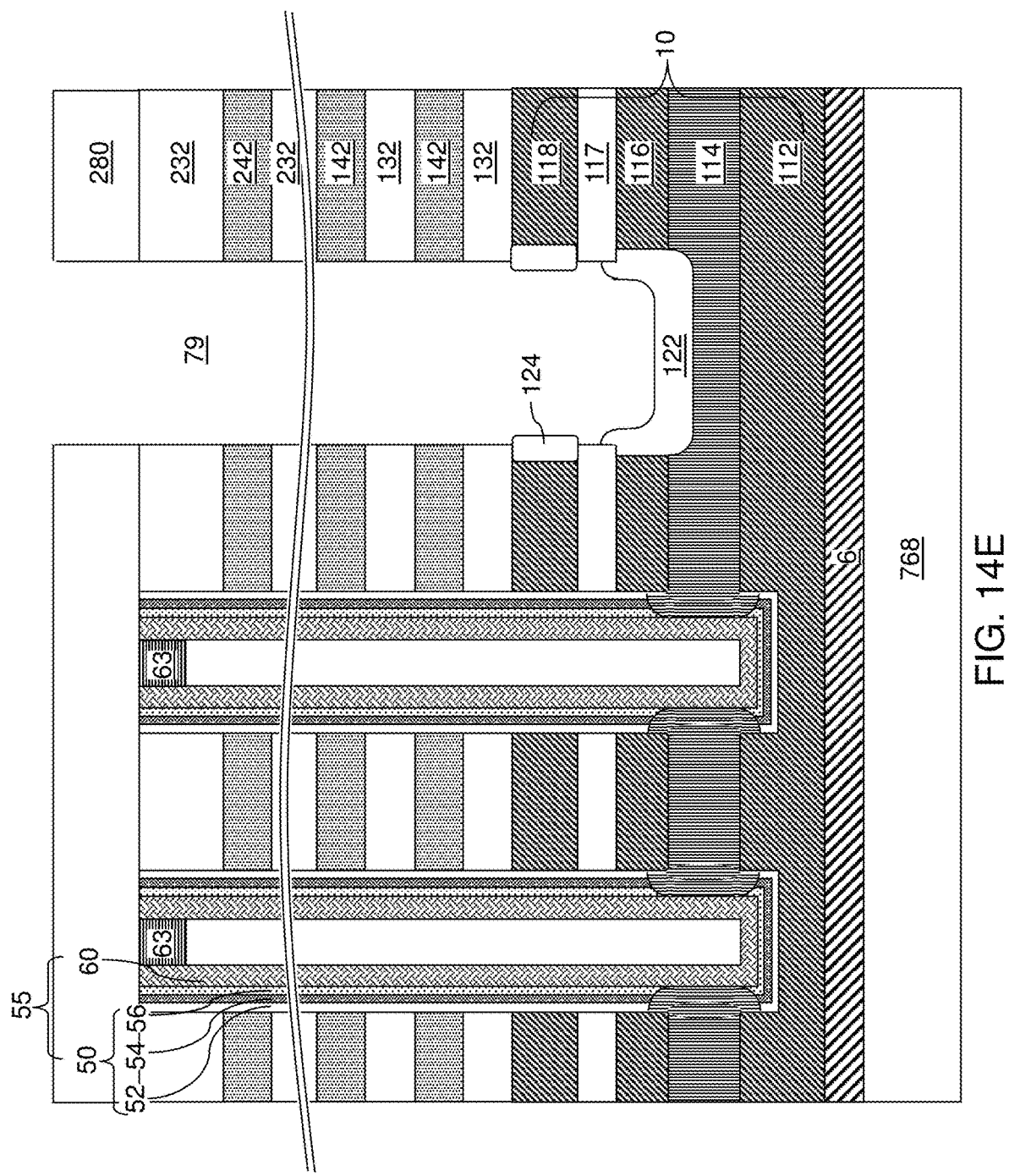

Referring to FIG. 14E, the backside trench spacers 77 may be removed selective to the insulating layers (132, 232), the insulating cap layer 70, the contact-level dielectric layer 80, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the insulating cap layer 70, the contact-level dielectric layer 80, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 15A:
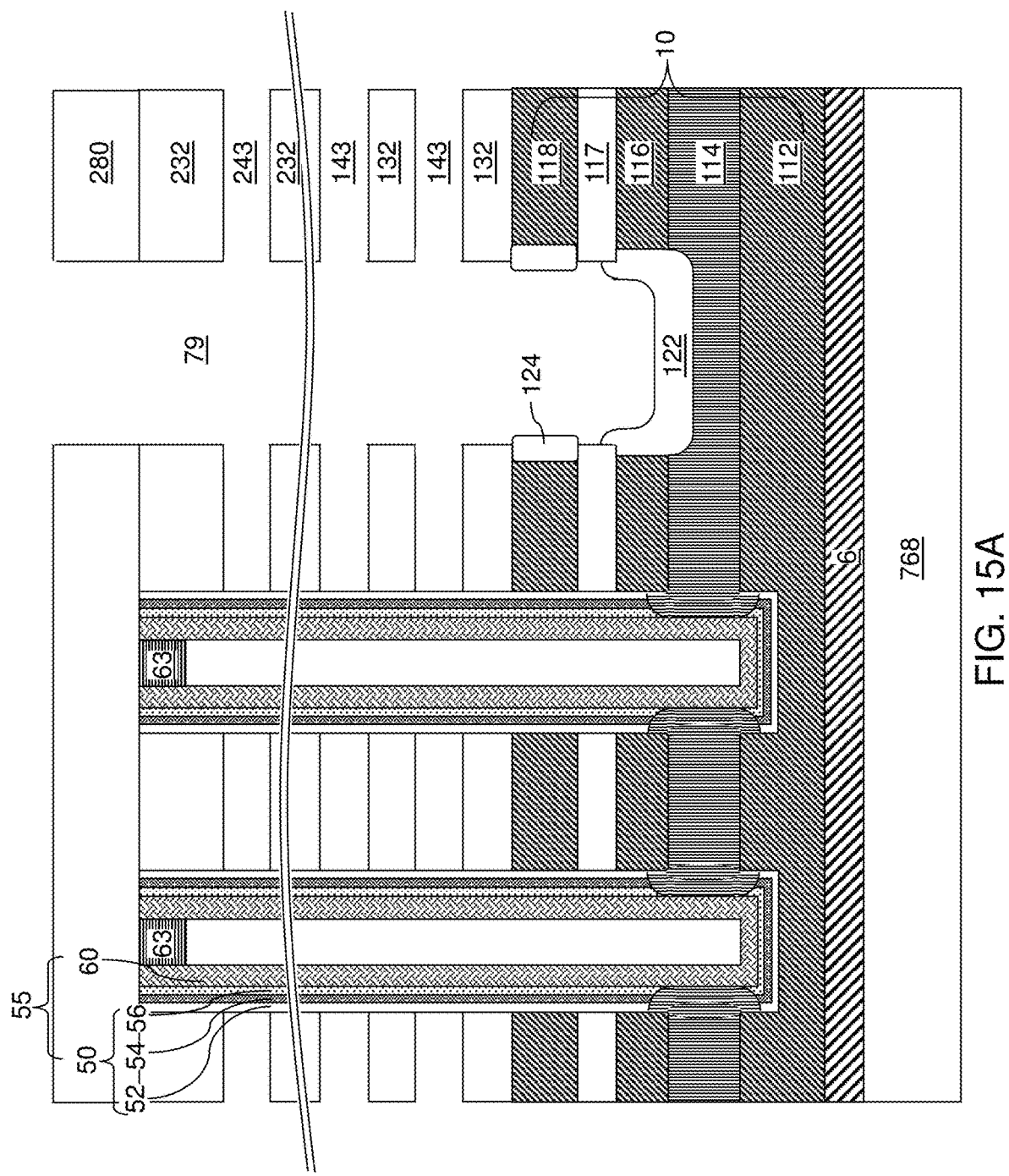
FIG. 15A illustrates a vertical cross-sectional view of memory opening fill structures and a backside trench after formation of backside recesses according to an embodiment of the present disclosure.
Figure 15B:
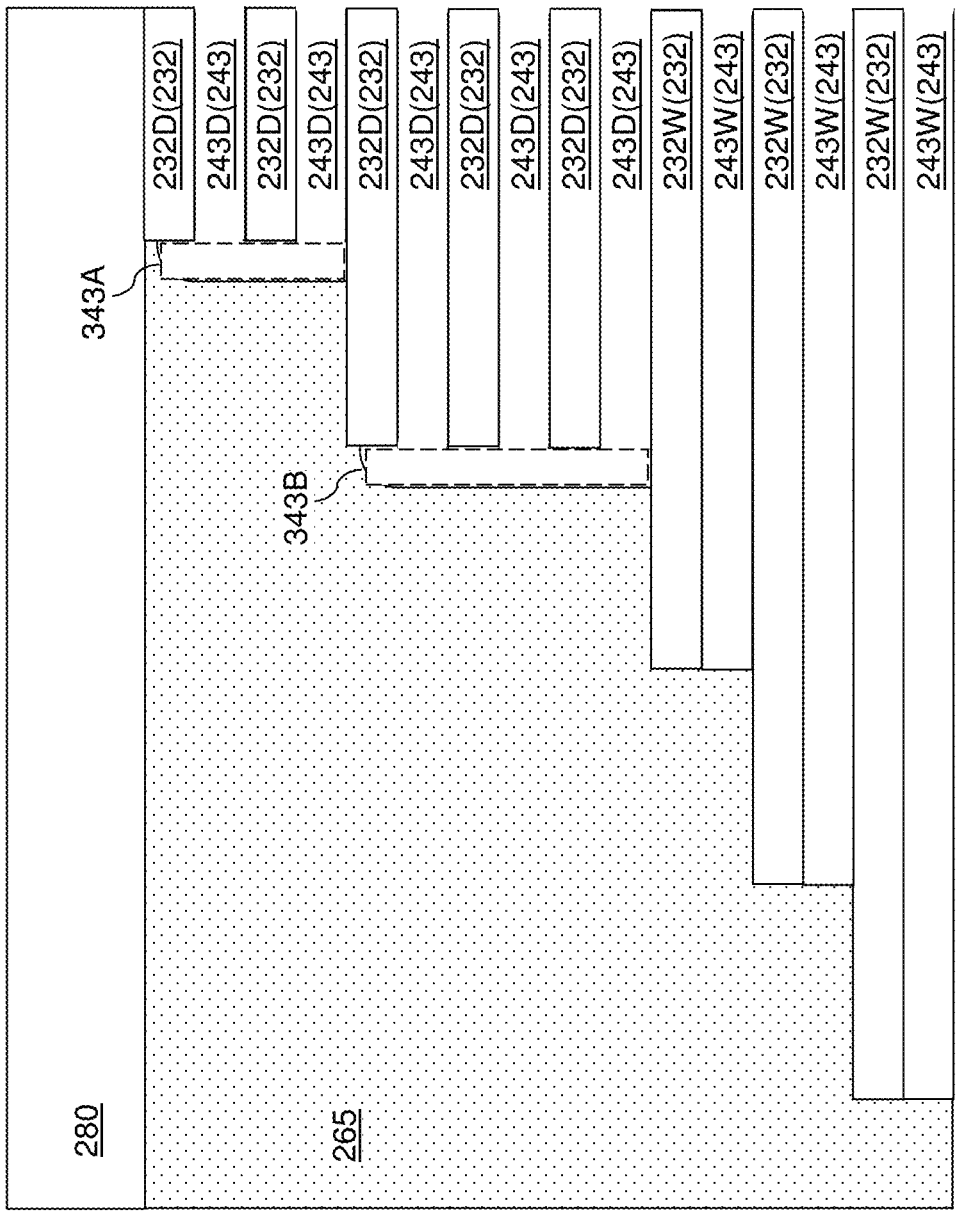
FIG. 15B is a vertical cross-sectional view of an upper region of the second vertically alternating sequence in the exemplary structure of FIG. 15A.

Referring to FIGS. 15A and 15B, the sacrificial material layers (142, 242) and the at least one sacrificial spacer (41A, 41B) can be removed selective to the insulating layers (132, 232), the contact-level dielectric layer 280, and the source contact layer 114, the dielectric semiconductor oxide plates 122, and the annular dielectric semiconductor oxide spacers 124 by performing an isotropic etch process. The sacrificial material layers (142, 242) and the at least one sacrificial spacer (41A, 41B) can be removed in a same isotropic etch step. For example, an isotropic etchant that selectively etches the materials of the sacrificial material layers (142, 242) and the at least one sacrificial spacer (41A, 41B) with respect to the materials of the insulating layers (132, 232), the contact-level dielectric layer 280, the retro-stepped dielectric material portions (165, 265), and the material of the outermost layer of the memory films 50 may be introduced into the backside trenches 79 during the isotropic etch process. For example, the sacrificial material layers (142, 242) may include silicon nitride, the materials of the insulating layers (132, 232), the contact-level dielectric layer 280, the retro-stepped dielectric material portion 65, and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) and the at least one sacrificial spacer (41A, 41B) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. First backside recesses 143 can be formed in volumes from which a first sacrificial material layer 142 is removed, and second backside recesses 243 can be formed in volumes from which a second sacrificial material layer 242 is removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The second insulating layers 232 can include word-line-level insulating layers 232W and drain-select-level insulating layers 232D. The word-line-level insulating layers 232W can have a vertical sidewall that extends in the second horizontal direction and that is a segment of a single-level vertical step, and the drain-select-level insulating layers 232D can include a vertical sidewall that extends in the second horizontal direction and that is a segment of a multi-level vertical step. The second backside recesses 243 can include word-line-level backside recesses 243W and drain-select-level backside recesses 243D. The word-line-level backside recesses 243W can be formed in volumes from which second sacrificial material layers 242 located at levels of the single-level vertical steps are removed. The drain-select-level backside recesses 243D can be formed in volumes from which second sacrificial material layers 242 located at levels of the multi-level vertical steps are removed. Thus, the drain-select-level backside recesses 243D can be formed in volumes from which a subset of the sacrificial material layers (142, 242) adjoined to the at least one sacrificial spacer (41A, 41B) is removed.

At least one spacer cavity (343A, 343B) is formed in volumes from which the at least one sacrificial spacer (41A, 41b) is removed. In the illustrated example, the at least one spacer cavity (343A, 343B) can include a first spacer cavity 343A that is formed in a volume from which a first sacrificial spacer 41A is removed, and a second spacer cavity 343B that is formed in a volume from which a second sacrificial spacer 41B is removed. Each of the at least one spacer cavity (343A, 343B) can be connected to a respective set of at least two drain-select-level backside recesses 243D. In the illustrated example, the first spacer cavity 343A can be connected to two drain-select-level backside recesses 243D, and the second spacer cavity 343B can be connected to three drain-select-level backside recesses 243D. Generally, each spacer cavity (343A, 343B) can be connected to two, three, four, five, or six drain-select-level backside recesses 243D, or to a greater number of drain-select-level backside recesses 243D.

Figure 16A:
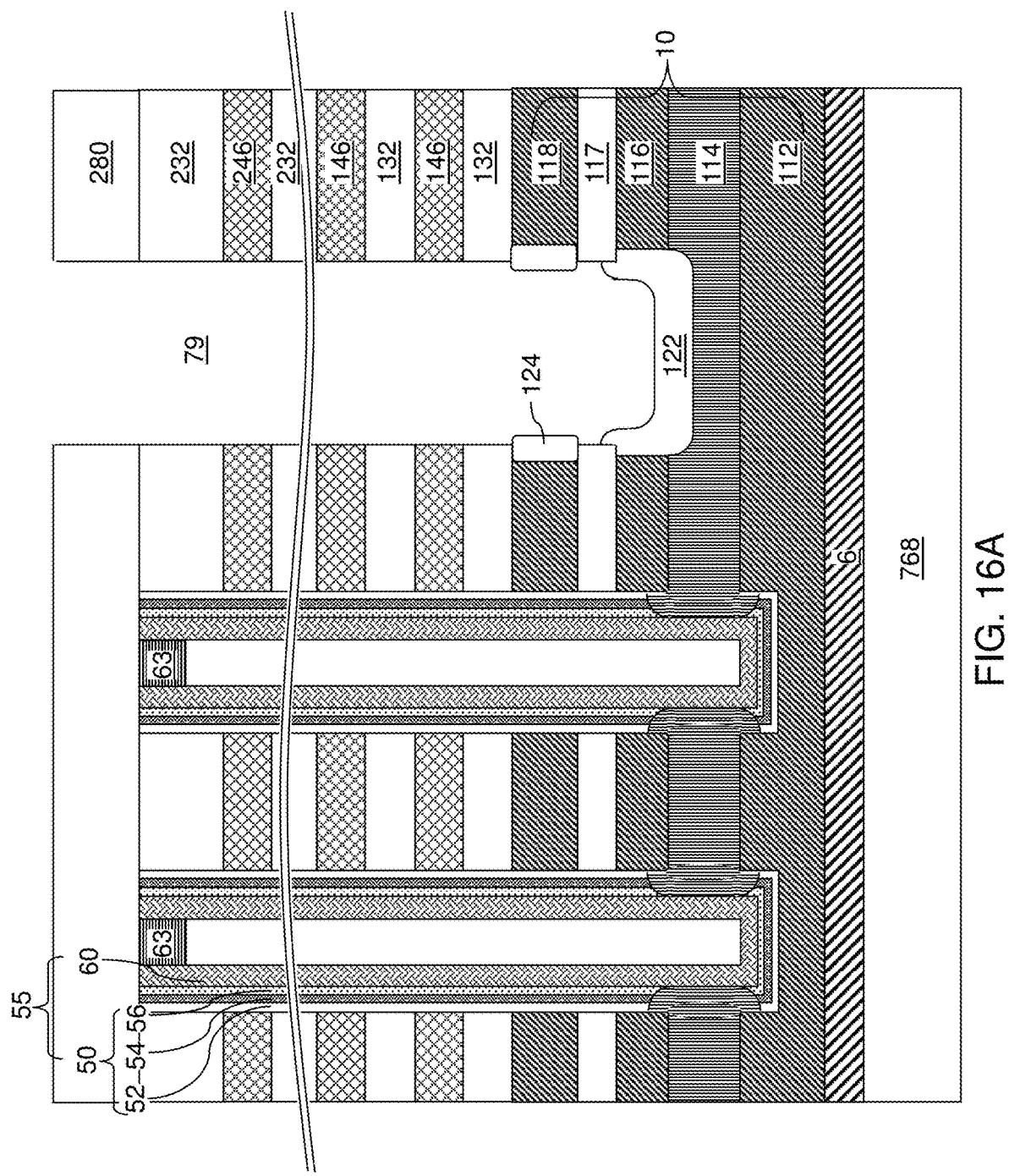
FIG. 16A is a schematic vertical cross-sectional view of memory opening fill structures and a backside trench after formation of electrically conductive layers according to an embodiment of the present disclosure.
Figure 16B:
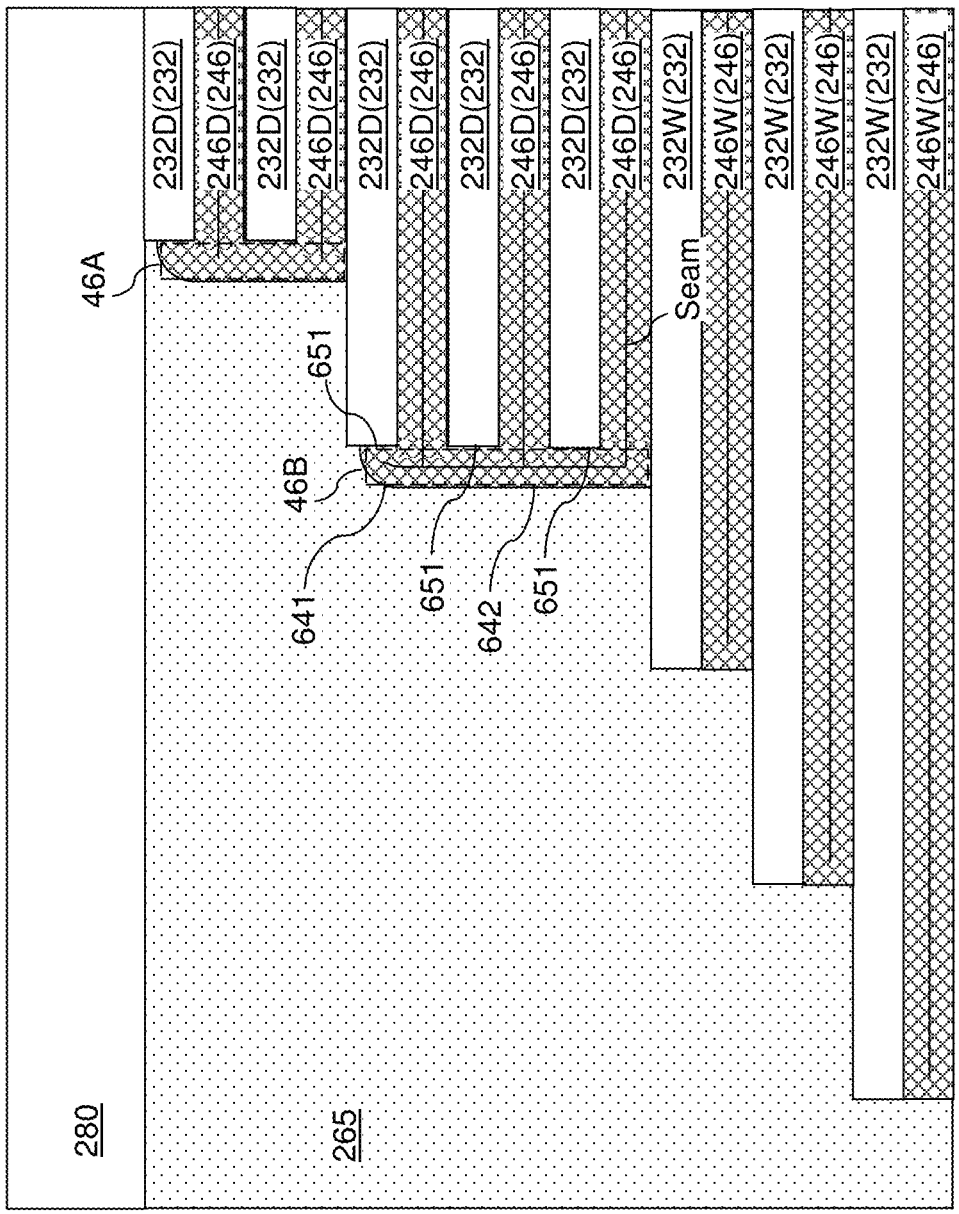
FIG. 16B is a vertical cross-sectional view of an upper region of the second vertically alternating sequence in the exemplary structure of FIG. 16A.
Figure 16C:
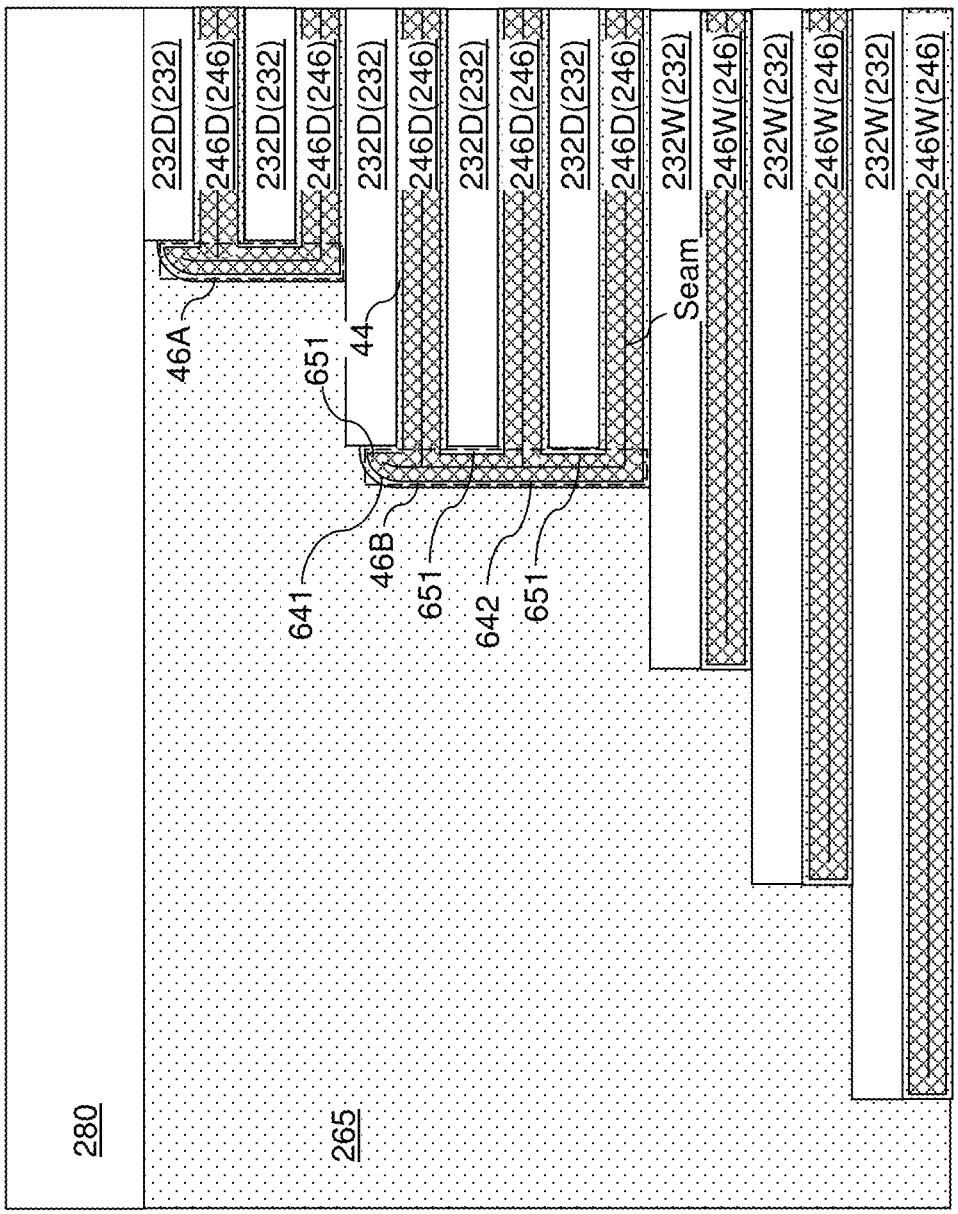
FIG. 16C is a vertical cross-sectional view of an upper region of the second vertically alternating sequence in an alternative embodiment of the exemplary structure at a processing step that corresponds to the processing steps of FIGS. 16A, and 16B.
Figure 16D:
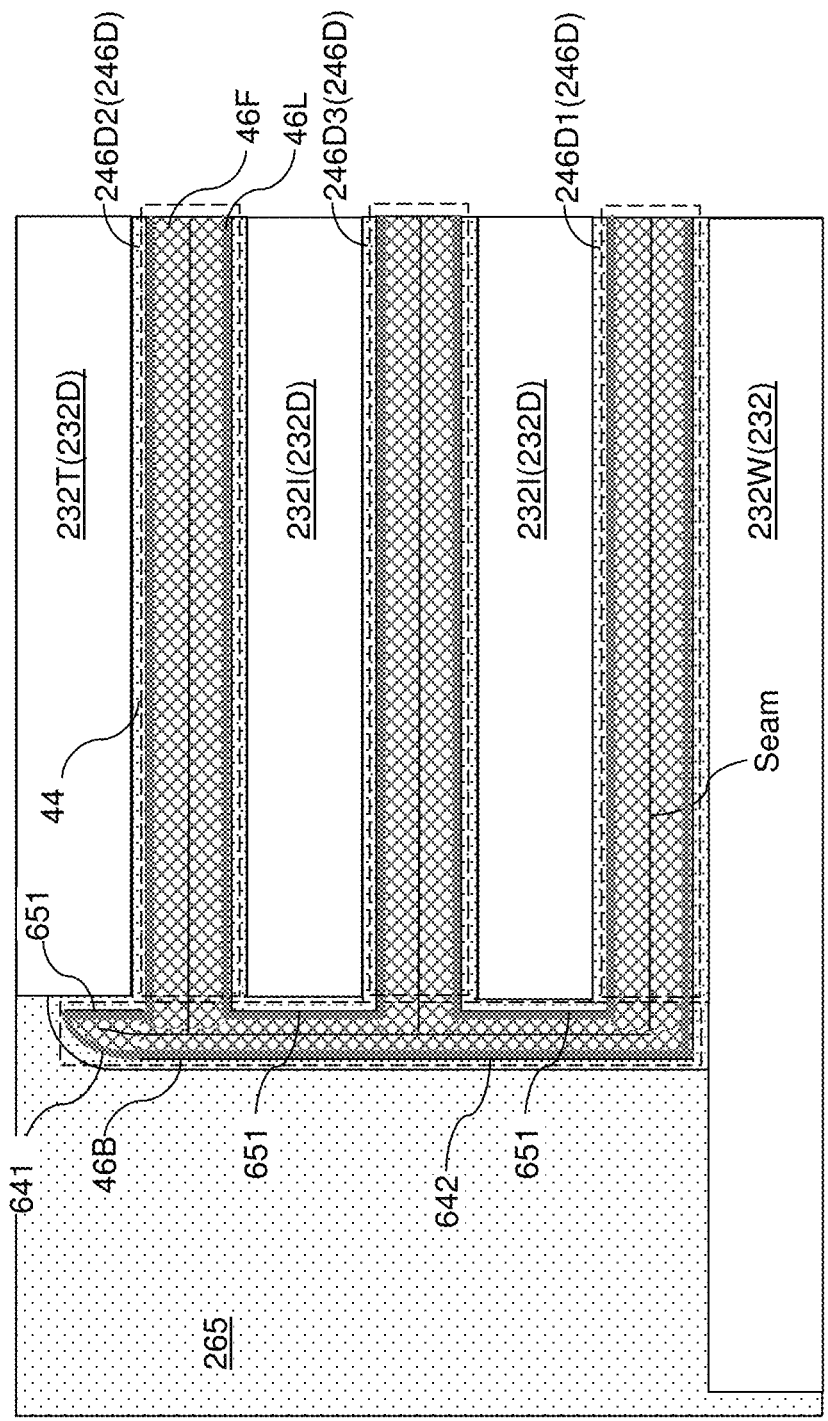
FIG. 16D is a magnified view of a portion of the upper region of the second vertically alternating sequence within FIG. 16C.

FIG. 16A is a schematic vertical cross-sectional view of memory opening fill structures and a backside trench after formation of electrically conductive layers according to an embodiment of the present disclosure. FIG. 16B is a vertical cross-sectional view of an upper region of the second vertically alternating sequence in the exemplary structure of FIG. 16A. FIG. 16C is a vertical cross-sectional view of an upper region of the second vertically alternating sequence in an alternative embodiment of the exemplary structure at a processing step that corresponds to the processing steps of FIGS. 16A, and 16B. FIG. 16D is a magnified view of a portion of the upper region of the second vertically alternating sequence within FIG. 16C.

Referring collectively to FIGS. 16A-16D, a backside blocking dielectric layer 44 may be optionally deposited in the backside recesses (143, 243) and the backside trenches 79 and over the contact-level dielectric layer 280 (as illustrated in FIGS. 16C and 16D). The backside blocking dielectric layer 44 includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a metallic barrier liner 46L that includes a conductive metallic nitride material such as TiN, TaN, WN, or a combination thereof, and a metallic fill material layer 46F such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material, and an electrically conductive spacer (46A, 46B) can be formed in each spacer cavity (343A, 343B). A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may include a seam located within a respective horizontal plane that is equidistant from a top surface and a bottom surface of the respective electrically conductive layer (146, 246).

A subset of the electrically conductive layers (146, 246) may comprise word lines (e.g., 246W) for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first sacrificial material layers 142 and the second sacrificial material layers 242 are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first insulating layers 132, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second insulating layers 232, and the second electrically conductive layers 246 comprise a second subset of the electrically conductive layers (146, 246) that is interlaced with the second insulating layers 246.

Generally, the electrically conductive layers (146, 246) and the at least one electrically conductive spacer (46A, 46B) can be formed in volumes from which the sacrificial material layers (142, 242) and the at least one sacrificial spacer (41A, 41B) are removed by providing a reactant for depositing a conductive material into the backside trenches 79. The at least one electrically conductive material of the electrically conductive layers (146, 246) and the at least one electrically conductive spacer (46A, 46B) can be deposited simultaneously in the drain-select-level backside recesses 243D and in the at least one spacer cavity (343A, 343B).

The second electrically conductive layers 246 can comprise word-line-level electrically conductive layers 246W that are formed within the volumes of the word-line-level backside recesses 243W, and drain-select-level electrically conductive layers 246D that are formed within volumes of the drain-select-level backside recesses 243D. Generally, each electrically conductive spacer (46A, 46B) can be connected to a plurality of drain-select-level electrically conductive layers 246D. In one embodiment shown in FIG. 16D, a set of electrically conductive layers connected to a same electrically conductive spacer (e.g., 46B) may comprise a first drain-select-level electrically conductive layer 246D1 and a second drain-select-level electrically conductive layer 246D2 having a same lateral extent. In one embodiment, the at least one electrically conductive spacer (46A, 46B) may comprise an electrically conductive spacer (e.g., 46B) extending vertically from the first drain-select-level electrically conductive layer 246D1 to the second drain-select-level electrically conductive layer 246D2 and adjoined to each of the first drain-select-level electrically conductive layer 246D1 to the second drain-select-level electrically conductive layer 246D2. In one embodiment, the electrically conductive spacer (e.g., 46B), the first drain-select-level electrically conductive layer 246D1, and the second drain-select-level electrically conductive layer 246D2 can be formed as a single continuous structure without any interface among the electrically conductive spacer (46B), the first drain-select-level electrically conductive layer 246D1, and the second drain-select-level electrically conductive layer 246D2. In one embodiment, an entirety of a contiguous set of an electrically conductive spacer (46B), a first drain-select-level electrically conductive layer 246D1, and a second drain-select-level electrically conductive layer 246D2 can be of integral construction and without any interface among the electrically conductive spacer (46B), the first drain-select-level electrically conductive layer 246D1, and the second drain-select-level electrically conductive layer 246D2. In one embodiment, a seam may continuously extend through each of the electrically conductive spacer (e.g. 46B), the first drain-select-level electrically conductive layer 246D1, and the second drain-select-level electrically conductive layer 246D2 (and optionally a third drain-select-level electrically conductive layer 246D3) within the contiguous set of the electrically conductive spacer (46B), the first drain-select-level electrically conductive layer 246D1, and the second drain-select-level electrically conductive layer 246D2 (and optionally the third drain-select-level electrically conductive layer 246D3).

In one embodiment, a retro-stepped dielectric material portion (such as the second-tier retro-stepped dielectric material portion 265) overlies the stepped surfaces in the staircase region, contacts sidewalls of a subset of the insulating layers (132, 232) located below the drain-select-level electrically conductive layers, and does not contact at least one intervening insulating layer 232D located between the first drain-select-level electrically conductive layer 246D1 and the second drain-select-level electrically conductive layer 246D2 as illustrated in FIGS. 16B, 16C, and 16D.

In one embodiment, each of the first drain-select-level electrically conductive layer 246D1 and the second drain-select-level electrically conductive layer 246D2 comprises a respective horizontally-extending seam, and the electrically conductive spacer (e.g., 46B) comprises a vertically-extending seam that is adjoined to the horizontally-extending seams of the first drain-select-level electrically conductive layer 246D1 and the second drain-select-level electrically conductive layer 246D2.

In one embodiment, a horizontally-extending seam within the first drain-select-level electrically conductive layer 246D1 is equidistant from a top surface and a bottom surface of the first drain-select-level electrically conductive layer 246D1, a horizontally-extending seam within the second drain-select-level electrically conductive layer 246D2 is equidistant from a top surface and a bottom surface of the second drain-select-level electrically conductive layer 246D2, and the vertically-extending seam is equidistant from an inner sidewall and an outer sidewall of the electrically conductive spacer (e.g., 46B). In one embodiment, a single metallic barrier liner 46L continuously extends through each of the first drain-select-level electrically conductive layer 246D1, the second drain-select-level electrically conductive layer 246D2, and the electrically conductive spacer (46B); and a single metallic fill material layer 46F continuously extends through each of the first drain-select-level electrically conductive layer 246D1, the second drain-select-level electrically conductive layer 246D2, and the electrically conductive spacer (46B).

In one embodiment, a single backside blocking dielectric layer 44 continuously extends between any first element that is selected from the first drain-select-level electrically conductive layer 246D1, the second drain-select-level electrically conductive layer 246D2, and the electrically conductive spacer (46B), and any second element that is selected from a retro-stepped dielectric material portion (such as the second-tier retro-stepped dielectric material portion 265) and at least one intervening insulating layer 232D located between the first drain-select-level electrically conductive layer 246D1 and the second drain-select-level electrically conductive layer 246D2, for example, as illustrated in FIGS. 16C and 16D.

In one embodiment, the single metallic barrier liner 46L contacts each of the retro-stepped dielectric material portion (such as the second retro-stepped dielectric material portion 265) and at least one intervening insulating layer 232D located between the first drain-select-level electrically conductive layer 246D1 and the second drain-select-level electrically conductive layer 246D2, for example, as illustrated in FIG. 16B.

In one embodiment, the electrically conductive spacer (46A or 46B) comprises a contoured (i.e., not contained within a two-dimensional Euclidean plane) outer sidewall (641, 642) comprising a tapered upper outer sidewall segment 641 and a straight outer sidewall segment 642 adjoined to a bottom edge of the tapered upper outer sidewall segment 641, and straight inner sidewall segments 651 that are proximal to a sidewall of a respective insulating layer 232D. The respective insulating layer 232D is selected from at least one intervening insulating layer 2321 located between the first drain-select-level electrically conductive layer 246D1 and the second drain-select-level electrically conductive layer 246D2 or an insulating layer 232T of the insulating layers that overlie the at least one intervening insulating layer 2321 and is most proximate to the at least one intervening insulating layer 2321. In one embodiment, the electrically conductive spacer (46A or 46B) has a uniform lateral thickness between the straight outer sidewall segment 642 and the straight inner sidewall segments 651, and a variable lateral thickness that decreases with a vertical thickness from the substrate between the tapered upper outer sidewall segment 641 and the straight inner sidewall segments 651. In one embodiment, a third drain-select-level electrically conductive layer 246D3 may be adjoined to the electrically conductive spacer (46B).

In one embodiment, the retro-stepped dielectric material portion (such as the second-tier retro-stepped dielectric material portion 265) is in contact with a sidewall of each insulating layer 232W of the insulating layers of the alternating stack {(132, 146), (232, 246)} that underlies the first drain-select-level electrically conductive layer 246D1 and the second drain-select-level electrically conductive layer 246D2.

Figure 17A:
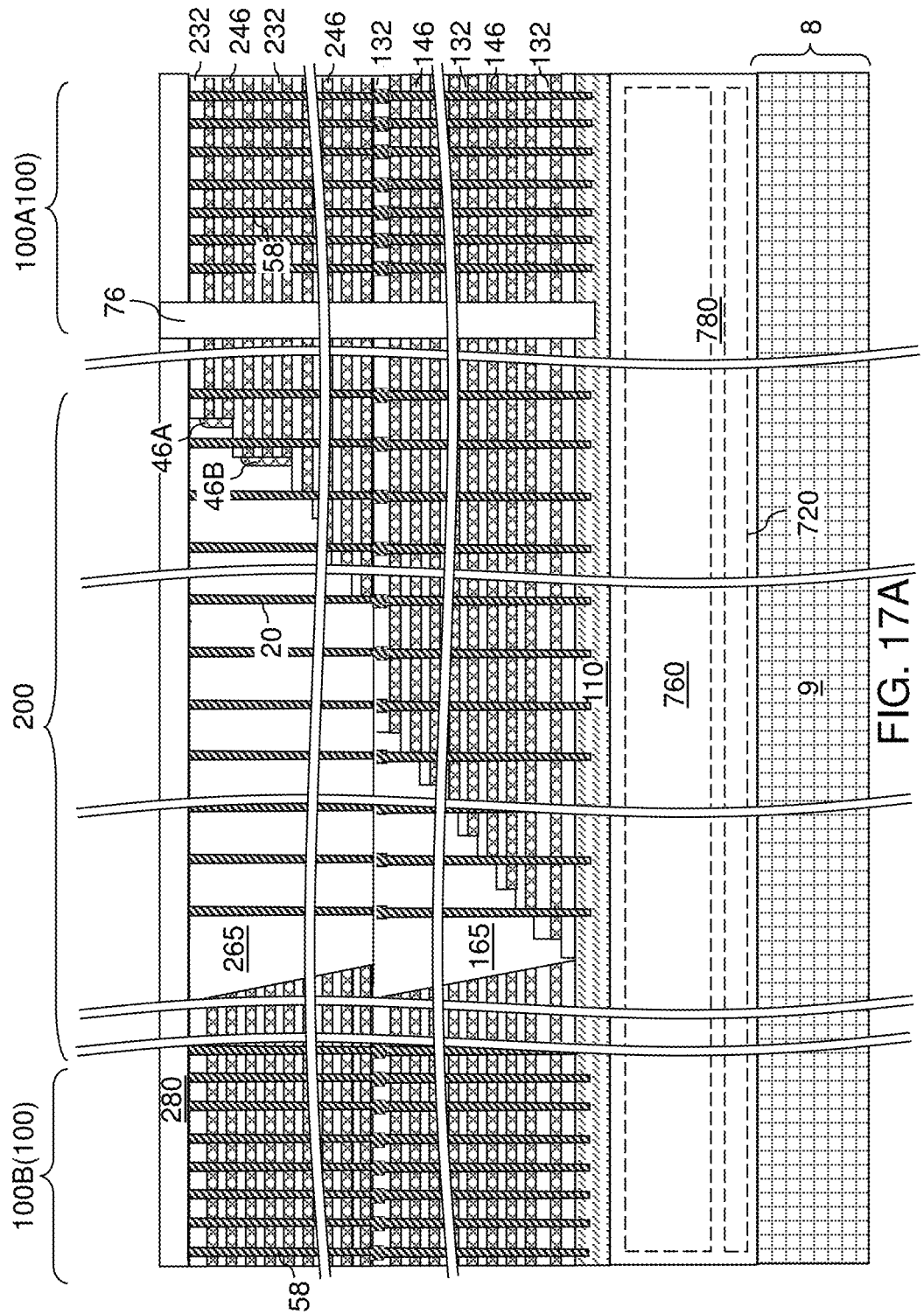
FIG. 17A is a vertical cross-sectional view of the exemplary structure after formation of drain-select-level isolation structures and backside trench fill structures according to an embodiment of the present disclosure.
Figure 17B:
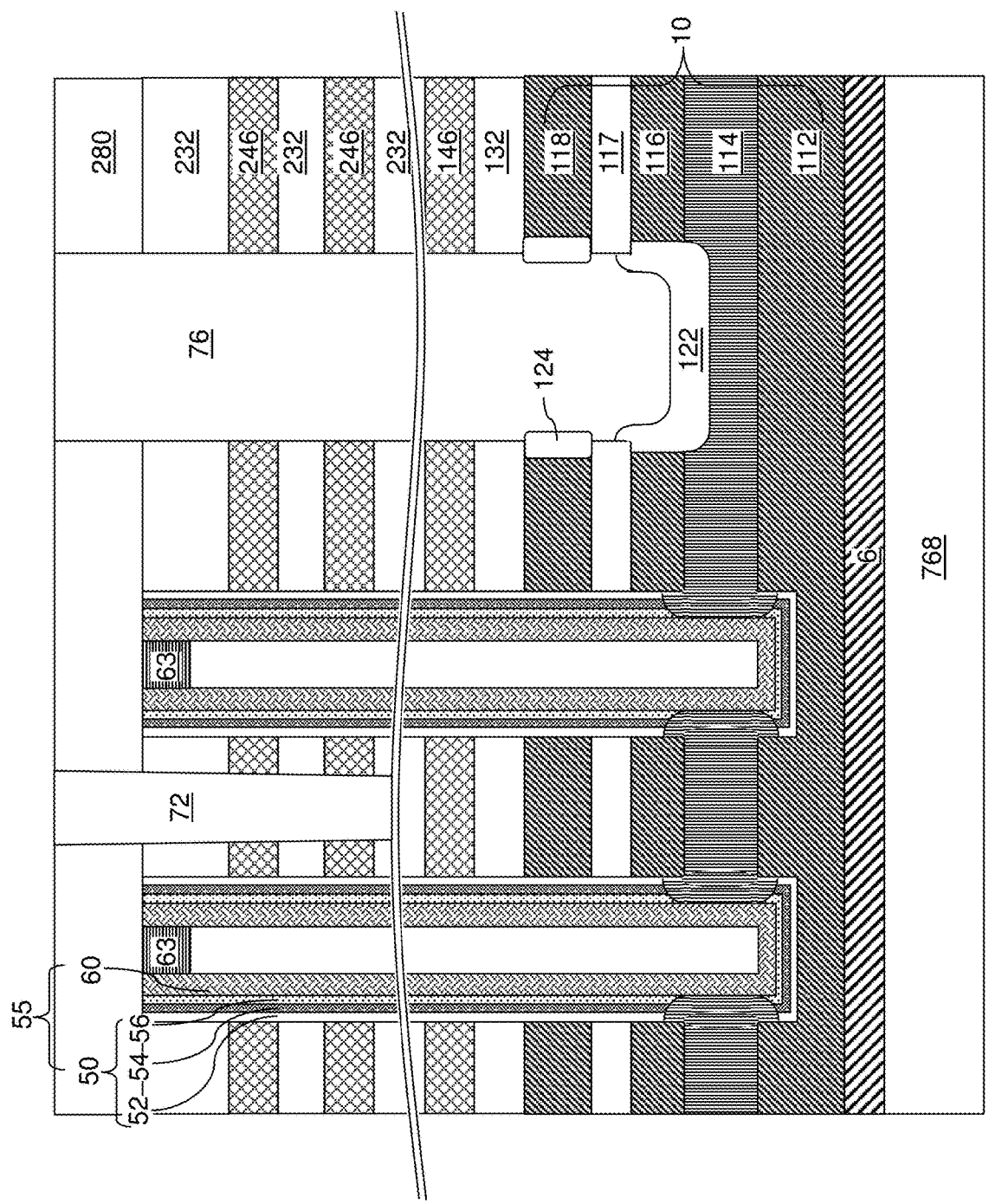
FIG. 17B is a vertical cross-sectional view of an upper region of the second vertically alternating sequence in the exemplary structure of FIG. 17A.
Figure 17C:
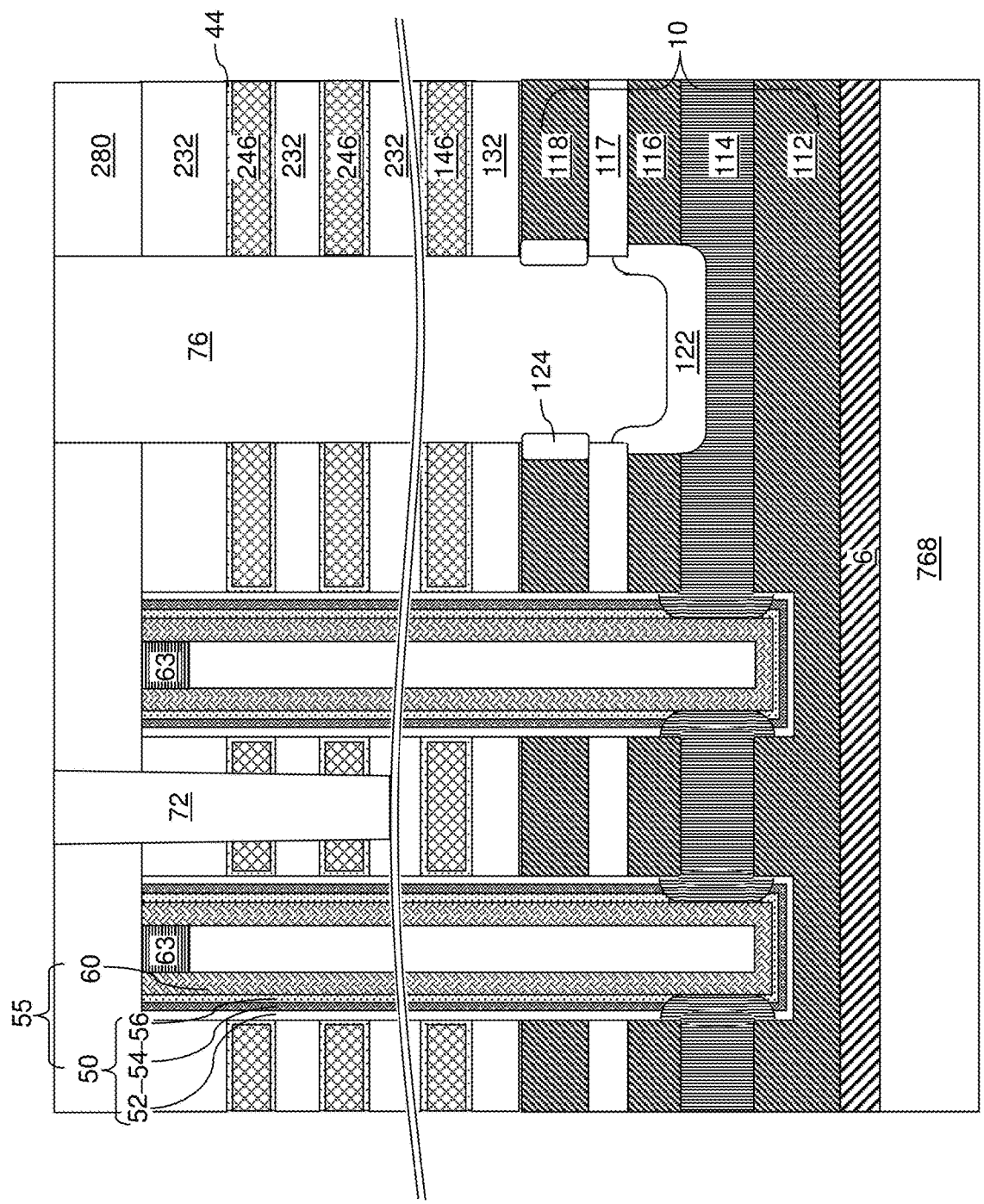
FIG. 17C is a vertical cross-sectional view of an upper region of the second vertically alternating sequence in an alternative embodiment of the exemplary structure at a processing step that corresponds to the processing steps of FIGS. 17A, and 17B.

FIG. 17A is a vertical cross-sectional view of the exemplary structure after formation of drain-select-level isolation structures and backside trench fill structures according to an embodiment of the present disclosure. FIG. 17B is a vertical cross-sectional view of an upper region of the second vertically alternating sequence in the exemplary structure of FIG. 17A. FIG. 17C is a vertical cross-sectional view of an upper region of the second vertically alternating sequence in an alternative embodiment of the exemplary structure at a processing step that corresponds to the processing steps of FIGS. 17A, and 17B.

Referring to FIGS. 17A-17C, a photoresist layer (not shown) can be applied over the contact-level dielectric layer, and can be lithographically patterned to form rectangular openings that laterally extend along the first horizontal direction hd1 within the memory array regions 100. An anisotropic etch process can be performed to transfer the pattern of the rectangular openings in the photoresist layer through the contact-level dielectric layer 280, the drain-select-level electrically conductive layers 246D, and the drain-select-level insulating layers 232D. Drain-select-level isolation trenches are formed in volumes from which the materials of the contact-level dielectric layer 280, the drain-select-level electrically conductive layers 246D, and the drain-select-level insulating layers 232D are removed. Each of the drain-select-level electrically conductive layers 246D can be divided into multiple discrete portions laterally surrounding a respective subset of the memory opening fill structures 58. The photoresist layer can be subsequently removed, for example, by ashing.

A dielectric material, such as silicon oxide, can be deposited in the backside trenches 79 and the drain-select-level isolation trenches by a conformal deposition process such as a chemical vapor deposition process. A backside trench fill structure 76 can be formed within each backside trench 79, and a drain-select-level isolation structure 72 can be formed within each of the drain-select-level isolation trenches. The backside trench fill structure 76 and the drain-select-level isolation structure 72 extend along the first horizontal direction (e.g., word line direction) hd1 and are spaced apart along the second horizontal direction hd2. Each alternating stack of insulating layers (132, 232) and electrically conductive layers (146, 246) can be laterally contacted by a pair of backside trench fill structures 76. In one embodiment, a three-dimensional memory device comprises a first backside trench fill structure 76 comprising a first dielectric surface that contacts first sidewalls of each layer within an alternating stack {(132, 146), (232, 246)}, and a second backside trench fill structure 76 comprising a second dielectric surface that contacts second sidewalls of each layer within the alternating stack {(132, 146), (232, 246)}. A retro-stepped dielectric material portion (such as a second-tier retro-stepped dielectric material portion 265) contacts one of the first dielectric surface and the second dielectric surface, and is laterally spaced from another of the first dielectric surface and the second dielectric surface, for example, as illustrated in FIG. 1B.

Figure 18A:
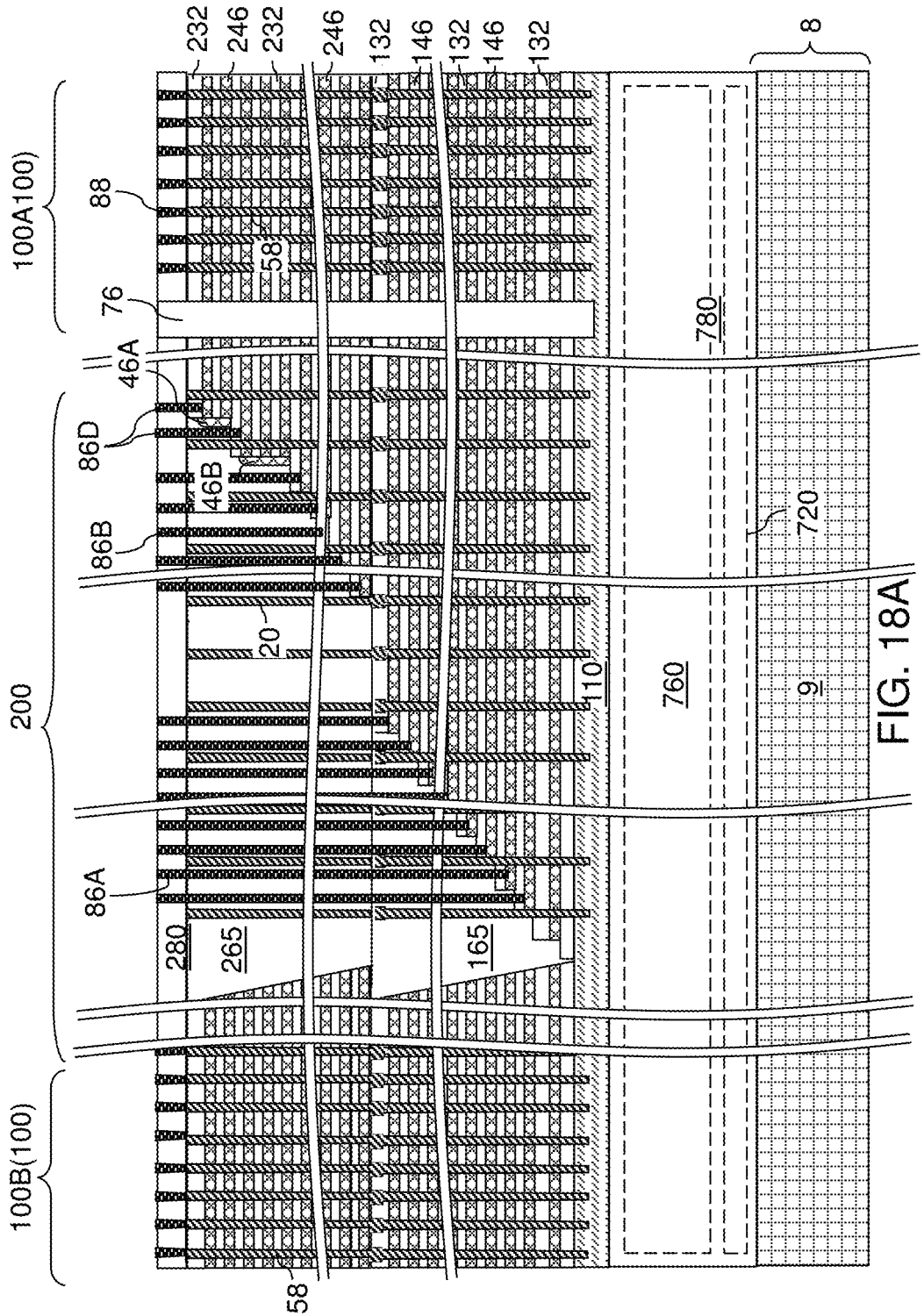
FIG. 18A is a schematic vertical cross-sectional view of the exemplary structure after formation of layer contact via structures according to an embodiment of the present disclosure.
Figure 18B:
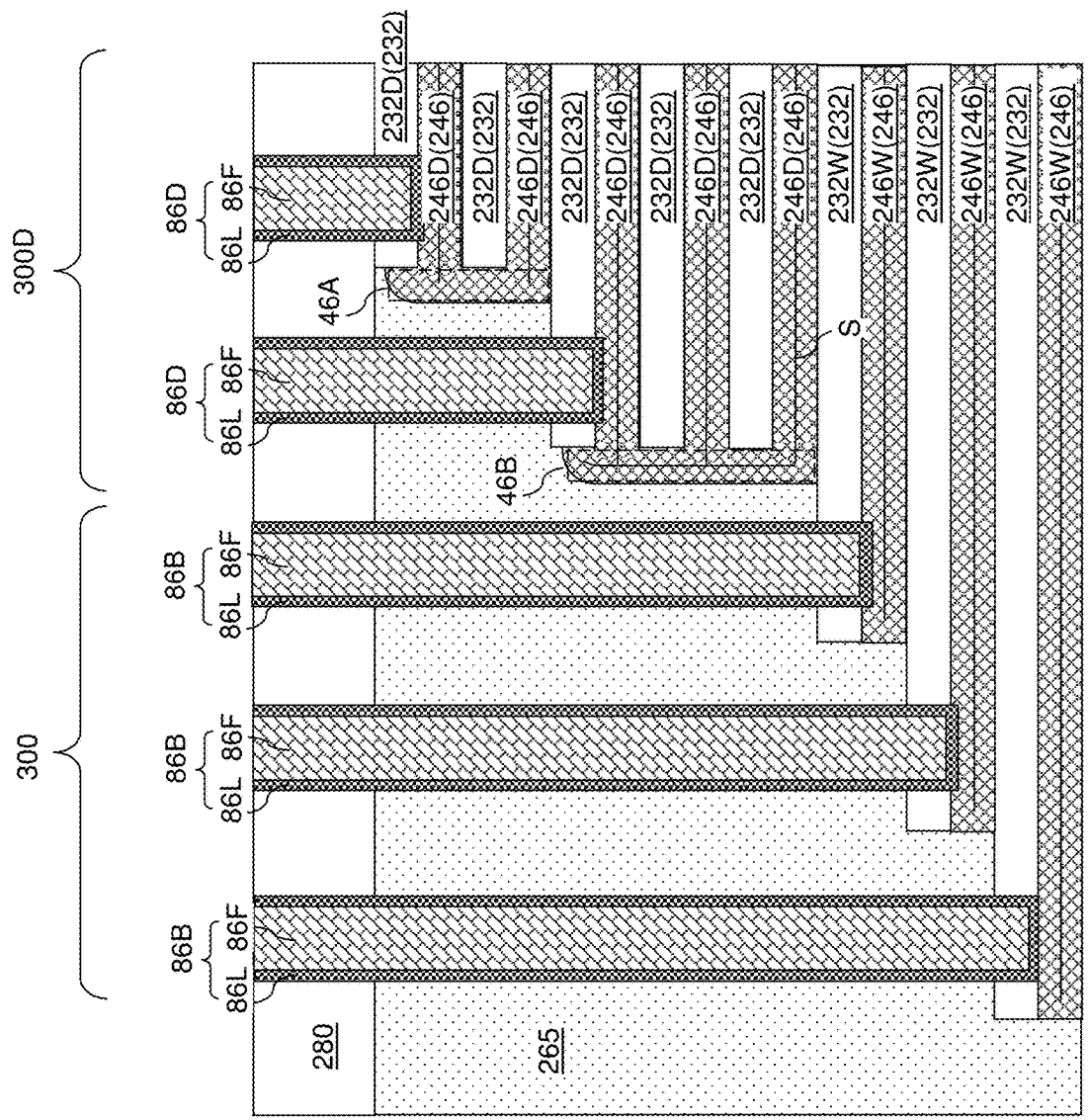
FIG. 18B is a vertical cross-sectional view of an upper region of the second vertically alternating sequence in the exemplary structure of FIG. 18A.
Figure 18C:
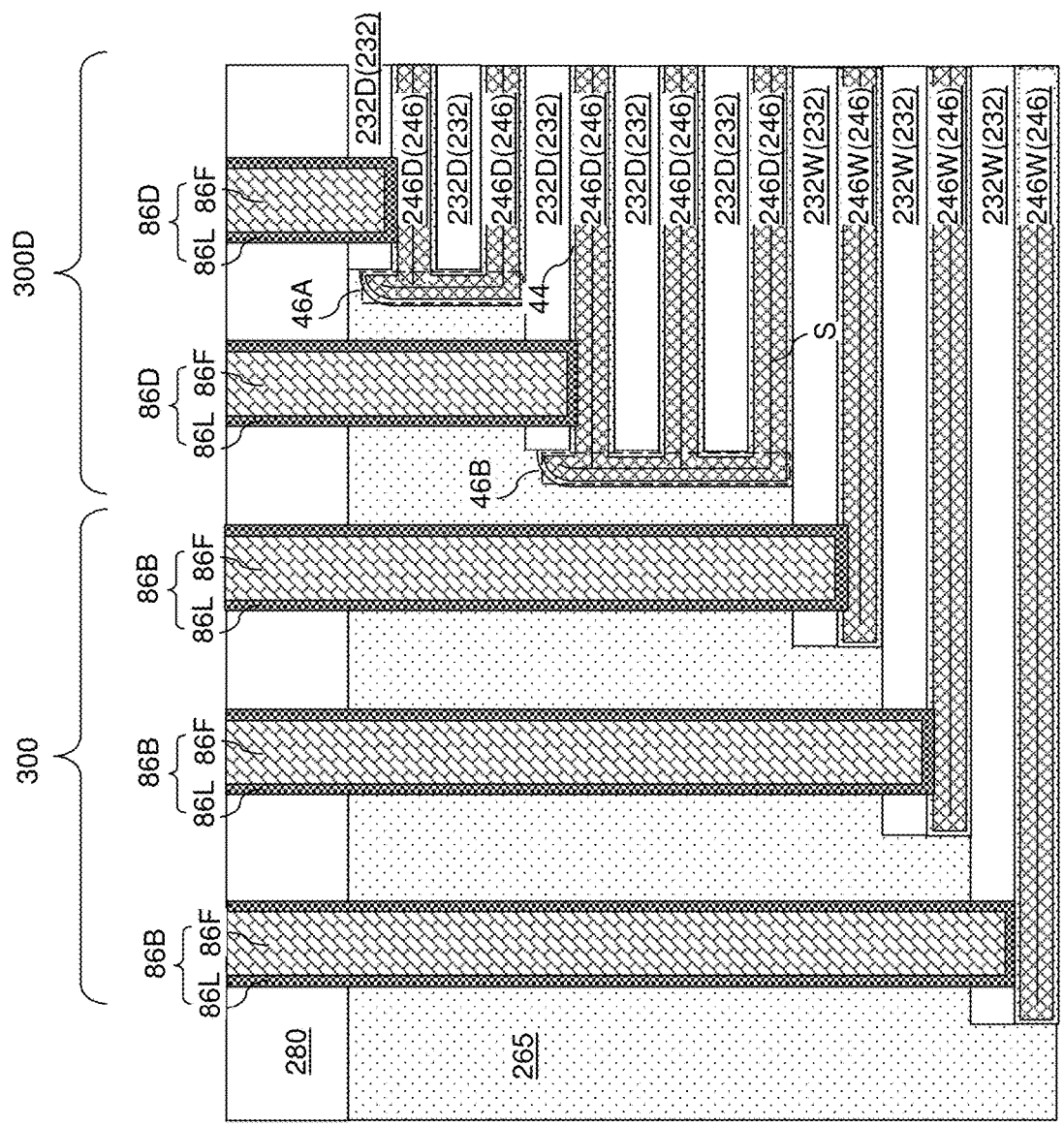
FIG. 18C is a vertical cross-sectional view of an upper region of the second vertically alternating sequence in an alternative embodiment of the exemplary structure at a processing step that corresponds to the processing steps of FIGS. 18A and 18B.

FIG. 18A is a schematic vertical cross-sectional view of the exemplary structure after formation of layer contact via structures according to an embodiment of the present disclosure. FIG. 18B is a vertical cross-sectional view of an upper region of the second vertically alternating sequence in the exemplary structure of FIG. 18A. FIG. 18C is a vertical cross-sectional view of an upper region of the second vertically alternating sequence in an alternative embodiment of the exemplary structure at a processing step that corresponds to the processing steps of FIGS. 18A and 18B.

Referring to FIGS. 18A-18C, a photoresist layer (not shown) may be applied over the contact-level dielectric layer 280, and may be lithographically patterned to form various contact via openings. For example, openings for forming drain contact via structures may be formed in the memory array region 100, and openings for forming staircase region contact via structures may be formed in the staircase region 300 located in the inter-array region 200. An anisotropic etch process is performed to transfer the pattern in the photoresist layer through the contact-level dielectric layers 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. First contact via structures 86A and second contact via structures 86B are formed in the staircase-region contact via cavities and on a top surface of a respective one of the electrically conductive layers (146, 246W). Drain-select-level contact via structures 86D that contact the drain-select-level electrically conductive layers 246D. Specifically, first and second contact via structures (86A, 86B) may include word line contact via structures that contact electrically conductive layers (e.g., word lines 146, 246W) that underlie the drain-select-level electrically conductive layers (e.g., drain side select gate electrodes) 246D and function as word lines for the memory stack structures 55.

Peripheral-region via cavities (not shown) may be formed through the contact-level dielectric layer 280, the second and first retro-stepped dielectric material portions (265, 165), and the drain-side dielectric layers 768 to top surfaces of a first subset of the lower-level metal interconnect structure 780 in the peripheral device region 400. At least one conductive material may be deposited in the peripheral-region via cavities. Excess portions of the at least one conductive material may be removed from above the horizontal plane including the top surface of the contact-level dielectric layer 280. Each remaining portion of the at least one conductive material in a peripheral-region via cavity constitutes a peripheral-region contact via structure (not illustrated).

At least one additional dielectric layer may be formed over the contact-level dielectric layer 280, and additional metal interconnect structures (herein referred to as upper-level metal interconnect structures) and bit lines extending in the second horizontal direction hd2 may be formed in the at least one additional dielectric layer Generally, the three-dimensional memory device may comprise a drain-select-electrode contact via structure 86D vertically extending through a retro-stepped dielectric material portion (such as the second-tier retro-stepped dielectric material portion 265) and contacting a top surface of an upper one of the first drain-select-level electrically conductive layer 246D1 and the second drain-select-level electrically conductive layer 246D2, and word-line contact via structures (86A, 86B) vertically extending through the retro-stepped dielectric material portion and contacting a top surface of a respective one of the word-line-level electrically conductive layers (146, 246W). In one embodiment, each drain-select-electrode contact via structure 86D and each word-line contact via structures (86A, 86B) may include a metallic barrier liner 86L and a metallic fill material portion 86F.

In one embodiment, the three-dimensional memory device comprises: a semiconductor material layer (such as a source contact layer 104) underlying the alternating stack {(132, 146), (232, 246)} and overlying the substrate 8;

lower-level metal interconnect structures 780 embedded in lower-level dielectric material layers 760 located between the substrate 8 and the semiconductor material layer; and laterally-isolated vertical interconnection structures (484, 486) (illustrated in FIGS. 1A-1E) comprising a respective through-memory-level conductive via structure 486 and a respective tubular insulating spacer 484, vertically extending through the alternating stack, and contacting a respective one of the lower-level metal interconnect structures 780.

In the embodiment shown in FIGS. 1B and 18A-18C, the multi-level vertical steps in the multi-level step region 300D are located adjacent to the single-level vertical steps of the staircase region 300, and the drain-select-electrode contact via structures 86D are located adjacent to the word-line contact via structures (86A, 86B) in the staircase region 300. However, in an alternative embodiment shown in FIGS. 19A and 19B, the multi-level vertical steps of the multi-level step region 300S and the drain-select-electrode contact via structures 86D are located at the ends of the memory array regions (100A, 100B), where the drain-select-level electrically conductive layers 246D terminate. In other words, in the alternative embodiment, the drain-select-level electrically conductive layers 246D may terminate in the respective memory array regions (100A, 100B) and not extend into the staircase region 300 or even into the inter-array region 200.

Referring to all drawings and according to various embodiments of the present disclosure in general and to FIGS. 1A-1E and 19A and 19B in particular, a three-dimensional memory device comprises an alternating stack of insulating layers (132, 232) and electrically conductive layers (146, 246), wherein the electrically conductive layers (146, 246) comprise word-line-level electrically conductive layers (146, 246W) and drain-select-level electrically conductive layers 246D located above the word-line-level electrically conductive layers (146, 246W). The device also includes a first backside trench fill structure 76 extending along a first horizontal direction hd1 and comprising a first dielectric surface that contacts first sidewalls of each layer within the alternating stack, and a second backside trench fill structure 76 extending along the first horizontal direction, separated from the first backside trench fill structure along a second horizontal hd2 direction perpendicular to the first horizontal direction, and comprising a second dielectric surface that contacts second sidewalls of each layer within the alternating stack. The device also comprises drain-select-level isolation structures 72 extending through the drain-select-level electrically conductive layers 246D but not the word-line-level electrically conductive layers (146, 246W) of alternating stack, wherein the drain-select-level isolation structures 72 extend in the first horizontal direction hd1 and are spaced apart along the second horizontal direction hd2. The device also comprises memory opening fill structures 58 vertically extending through the alternating stack in a memory array region 100 in which each layer within the alternating stack is present, wherein each of the memory opening fill structures 58 comprises a vertical semiconductor channel 60 and a memory film 50. The device also comprises an electrically conductive spacer 46 extending vertically and electrically connecting a first drain-select-level electrically conductive layer 246D1 of the drain-select-level electrically conductive layers 246D to a second drain-select-level electrically conductive layer 246D2 of the drain-select-level electrically conductive layers 246D. The electrically conductive spacer 46 extends along the second horizontal direction hd2 and contacts ends of the first and the second drain-select-level electrically conductive layers (246D1, 246D2) along the second horizontal direction hd2.

In one embodiment, major sidewalls of the drain-select-level isolation structures 72 extend along the first horizontal direction hd1 and contact major sidewalls of the first and the second drain-select-level electrically conductive layers (246D1, 246D2) along the first horizontal direction. The electrically conductive spacer 46 does not contact the major sidewalls of the first and the second drain-select-level electrically conductive layers (246D1, 246D2) along the first horizontal direction hd1.

The various embodiments of the present disclosure can be employed to reduce the contact area employed for the drain-select-level electrically conductive layers 246D, and increase the overall device density in a semiconductor die including the three-dimensional memory device. In other words, a single drain-select-electrode contact via structure 86D is used to electrically contact plural drain-select-level electrically conductive layers 246D that are electrically connected by the respective electrically conductive spacer (46A, 46B).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers, wherein the electrically conductive layers comprise word-line-level electrically conductive layers and drain-select-level electrically conductive layers located above the word-line-level electrically conductive layers;
a first backside trench fill structure extending along a first horizontal direction and comprising a first dielectric surface that contacts first sidewalls of each layer within the alternating stack;
a second backside trench fill structure extending along the first horizontal direction, separated from the first backside trench fill structure along a second horizontal direction perpendicular to the first horizontal direction, and comprising a second dielectric surface that contacts second sidewalls of each layer within the alternating stack;
a contact-level dielectric layer overlying the alternating stack;
drain-select-level isolation structures extending through the contact-level dielectric layer and the drain-select-level electrically conductive layers but not through the word-line-level electrically conductive layers of the alternating stack, wherein the drain-select-level isolation structures extend in the first horizontal direction and are spaced apart along the second horizontal direction;

memory opening fill structures vertically extending through the alternating stack in a memory array region in which each layer within the alternating stack is present, wherein each of the memory opening fill structures comprises a vertical semiconductor channel and a memory film, wherein an entirety of the memory opening fill structures underlies a bottom surface of the contact-level dielectric layer;

an electrically conductive spacer extending vertically and electrically connecting a first drain-select-level electrically conductive layer of the drain-select-level electrically conductive layers to a second drain-select-level electrically conductive layer of the drain-select-level electrically conductive layers, wherein the electrically conductive spacer extends along the second horizontal direction and contacts ends of the first and the second drain-select-level electrically conductive layers along the second horizontal direction; and an additional electrically conductive spacer extending vertically and electrically connecting a third drain-select-level electrically conductive layer of the drain-select-level electrically conductive layers to a fourth drain-select-level electrically conductive layer of the drain-select-level electrically conductive layers.

2. The three-dimensional memory device of claim 1, wherein:

the additional electrically conductive spacer extends along the second horizontal direction and contacts ends of the third and the fourth drain-select-level electrically conductive layers along the second horizontal direction;

the additional electrically conductive spacer is vertically offset from the electrically conductive spacer; and the additional electrically conductive spacer is laterally offset from the electrically conductive spacer along the first horizontal direction.

* * * * *